(12) United States Patent
Nishiyama

(10) Patent No.: US 8,036,036 B2
(45) Date of Patent: *Oct. 11, 2011

(54) SEMICONDUCTOR DEVICE AND A MANUFACTURING METHOD THEREOF

(75) Inventor: Nobuyasu Nishiyama, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 92 days.

This patent is subject to a terminal disclaimer.

(21) Appl. No.: 12/574,438

(22) Filed: Oct. 6, 2009

(65) Prior Publication Data

US 2010/0027338 A1    Feb. 4, 2010

Related U.S. Application Data

(63) Continuation of application No. 11/763,849, filed on Jun. 15, 2007, now Pat. No. 7,723,807.

(30) Foreign Application Priority Data

Jun. 16, 2006    (JP) ................................ 2006-168171

(51) Int. Cl.
    *G11C 16/04*    (2006.01)
(52) U.S. Cl. .......... 365/185.11; 365/185.05; 365/230.03
(58) Field of Classification Search ............. 365/185.05, 365/185.11, 230.03
    See application file for complete search history.

(56) References Cited

U.S. PATENT DOCUMENTS

| 7,084,440 | B2 | 8/2006 | Sel et al. |
| 7,112,858 | B2 | 9/2006 | Inaba et al. |
| 7,723,807 | B2 * | 5/2010 | Nishiyama .................... 257/401 |
| 2006/0046422 | A1 | 3/2006 | Tran et al. |
| 2007/0141780 | A1 | 6/2007 | Higashitani |

FOREIGN PATENT DOCUMENTS

| JP | 7-263677 | 10/1995 |
| JP | 2002-280388 | 9/2002 |
| JP | 2004-15056 | 1/2004 |
| JP | 2006-156657 | 6/2006 |

* cited by examiner

*Primary Examiner* — Hoai Ho
(74) *Attorney, Agent, or Firm* — Oblon, Spivak, McClelland, Maier & Neustadt, L.L.P.

(57) ABSTRACT

A semiconductor device includes at least two adjacent memory cell blocks, each of the memory cell blocks having a plurality of memory cell units, each of memory cell units having a plurality of electrically reprogrammable and erasable memory cells connected in series, a plurality of cell gates for selecting the plurality of memory cells within the two adjacent memory cell blocks, each of the plurality of cell gates being formed with roughly rectangular closed loops or roughly U shaped open loops, each of the loops being connected to a corresponding cell of the memory cells in a corresponding memory cell unit of the plurality of memory cell units within one of the two adjacent memory cell blocks and being connected to a corresponding memory cell of the memory cells in a corresponding memory cell unit of the plurality of memory cell units within the other memory cell block of the two adjacent memory cell blocks and a plurality of pairs of first and second selection gates for selecting the memory cell block, the plurality of cell gates being located between one pair of the first and second selection gates within a corresponding block of the memory cell block.

9 Claims, 37 Drawing Sheets

SEMICONDUCTOR DEVICE AND A MANUFACTURING METHOD THEREOF

CROSS-REFERENCE TO RELATED APPLICATIONS

This application is a continuation of and claims the benefit of priority under 35 U.S.C. §120 from U.S. Ser. No. 11/763,849 filed Jun. 15, 2007, which issued as U.S. Pat. No. 7,723,807 on May 25, 2010, and claims the benefit of priority under 35 U.S.C. §119 from Japanese Patent Application No. 2006-168171 filed Jun. 16, 2006, the entire contents of each of which are incorporated herein by reference.

TECHNICAL FIELD

This invention is related to the construction of a semiconductor device and a manufacturing method thereof.

BACKGROUND OF THE INVENTION

The miniaturization of semiconductors is progressing with each generation and largely relies on lithographic technology. As a result, especially in the formation of lines etc, forming a line and space pattern which has a narrower width than lithography's resolution limit is generally difficult.

To cope with this type of problem, a method is proposed whereby a sidewall pattern is formed on a dummy pattern sidewall and etching a material to be processed using this sidewall pattern as a mask is performed. This is known as (sidewall mask transfer technology). According to this method, it is possible to form a line and space pattern at a pitch of half the pitch of the dummy pattern (for example, see Japanese Patent Laid-Open Publications No. H07-263677, U.S. Pat. No. 7,112,858 and Japanese Patent Laid-Open Publications No. 2002-280388).

However, even by this method, forming precisely and effectively a line and space pattern or a whole pattern which includes another pattern is in many cases difficult. Also, for example, in the case of forming a cell gate (usually known as a word line but will be explained hereinafter referred to as a cell gate) it is pointed out that when forming a dummy pattern the pattern end becomes narrow or breaks off and there is a danger of it becoming what is called narrow open. Therefore, as miniaturization further progresses, arranging a contact with a sufficient adjustment margin on a line formed using sidewall mask transfer technology is thought to become difficult.

SUMMARY OF THE INVENTION

A semiconductor device according to one embodiment of the present invention comprises at least two adjacent memory cell blocks, each of said memory cell blocks having a plurality of memory cell units, each of memory cell units having a plurality of electrically reprogrammable and erasable memory cells connected in series, a plurality of cell gates for selecting said plurality of memory cells within said two adjacent memory cell blocks, each of said plurality of cell gates being formed with roughly rectangular closed loops or roughly U shaped open loops, each of said loops being connected to a corresponding cell of said memory cells in a corresponding memory cell unit of said plurality of memory cell units within one of said two adjacent memory cell blocks and being connected to a corresponding memory cell of said memory cells in a corresponding memory cell unit of said plurality of memory cell units within the other memory cell block of said two adjacent memory cell blocks and a plurality of pairs of first and second selection gates for selecting said memory cell block, said plurality of cell gates being located between one pair of said first and second selection gates within a corresponding block of said memory cell block.

A semiconductor device according to one embodiment of the present invention comprises at least two adjacent transistor blocks, each of said transistor blocks having a plurality of transistors and a plurality of gates for selecting said plurality of transistors within said two adjacent transistor blocks, each of said plurality of gates being formed with roughly U shaped open loops, each of said loops being arranged symmetrically so that their respective openings face each other in said two adjacent transistor blocks.

A method of manufacturing a semiconductor device according to one embodiment of the present invention comprises depositing a first hard mask on a material to be processed, forming a first resist pattern of a roughly rectangular closed loop on said first hard mask, etching said first hard mask into a roughly rectangular closed loop using said first resist pattern as a mask, depositing a second hard mask on said material and said first hard mask after removing said first resist pattern, etching said second hard mask anisotropically into a roughly rectangular closed loop which encloses said first hard mask on both sides of said first hard mask and etching said material using said second mask with a roughly rectangular closed loop as a mask after selectively removing said first hard mask.

DETAILED DESCRIPTION OF THE INVENTION

Embodiment 1

The miniaturization of semiconductors is progressing with each generation but this miniaturization largely relies on lithographic technology. However, in the flash memory road map where pitch width is smaller than 100 nm (gate length is less than 50 nm) prior miniaturization than the road map of an exposure device is being demanded. Also, in order to meet the demands of miniaturization expensive exposure device equipment is required.

In order to meet the demands of this miniaturization various responses are been considered, however, given the level of present technology, particularly gate and shallow trench isolation (hereinafter referred to as STI) achieving the demanded size is thought to be difficult if only exposure technology is used when forming a wire. Therefore, in order to meet the demanded size, if the sidewall mask transfer technology, as stated below, is not used the demanded size can not be achieved. Also, because there is no need to use expensive exposure device equipment, costs can be better minimized by using sidewall mask transfer technology.

Here, the general sidewall mask transfer technology will be explained. The diagrams 28 to 32 are construction diagrams of the semiconductor device when a gate is formed using sidewall mask transfer technology. In the diagrams 28 to 32, (A) is a cross sectional view and (B) is a horizontal view.

Figure 28:
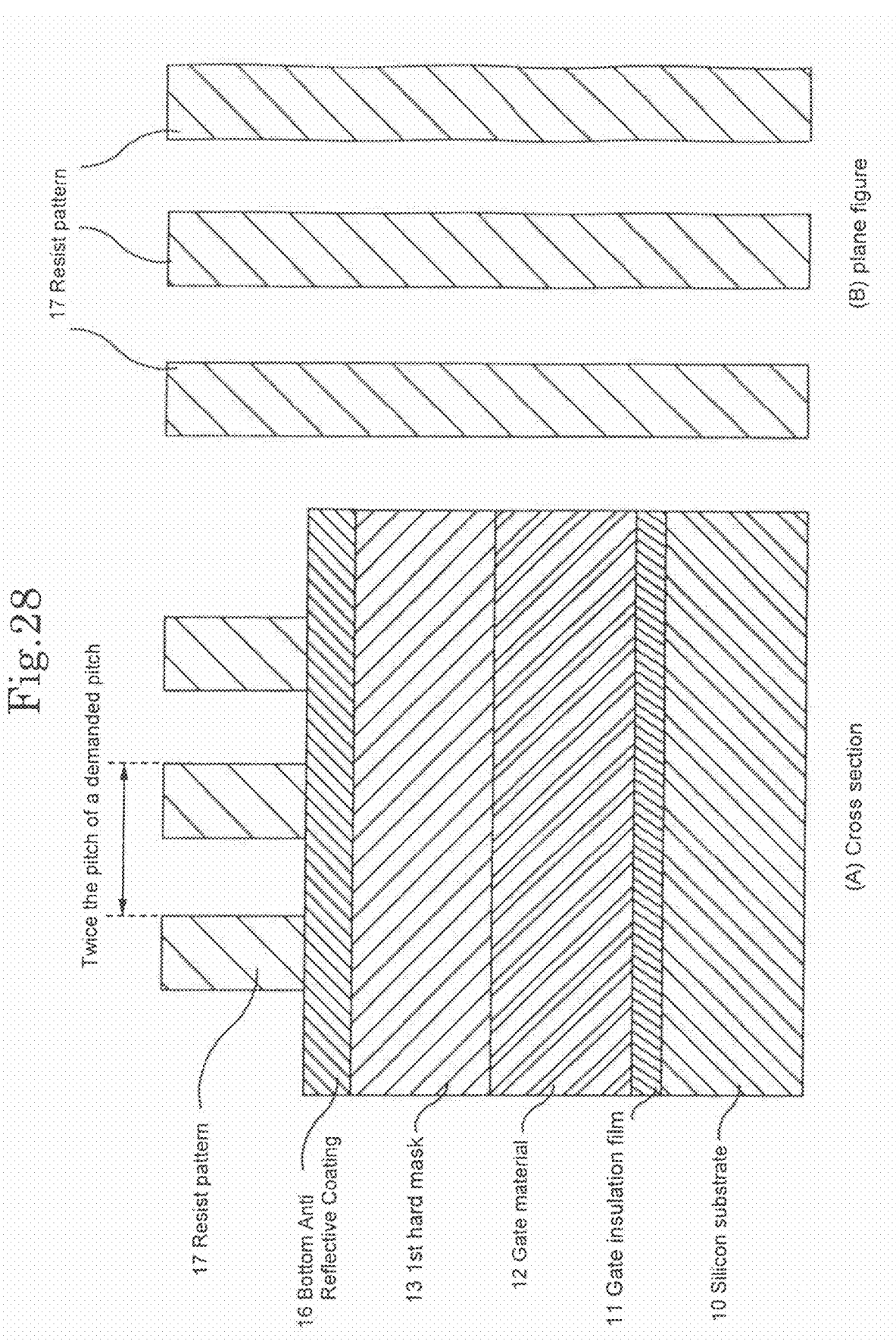
FIG. 28 is a construction diagram of a first process of the semiconductor device where a gate is formed using sidewall mask transfer technology.

Firstly, as shown in FIG. 28, on a silicon substrate 10 formed by a transistor etc of a semiconductor element, a gate insulation layer 11 of a silicon dioxide film etc is formed by a thermal oxidization process etc. Further, A gate material layer 12 (in FIG. 28 a poly-silicon layer is simply shown) formed from a three layer construction of poly-silicon, an insulation layer and another poly-silicon layer using CVD technology is deposited on gate insulation layer 11. Further, the gate material layer can be a three layer construction or simply one poly-silicon layer.

Next, a first hard mask 13 of $SiO_2$ etc is deposited on the poly-silicon layer 12 by using CVD technology. Further, in order to prevent reflected light acting on resist pattern 17 a Bottom Anti-Reflective Coating (hereinafter referred to as BARC 16) is deposited using spin-coat technology. This is because, together with short wave lengthening of exposure light via the miniaturization of process size, exposure is performed using an excimer laser, but when an excimer laser is used, the effects of reflection from the oxide film compared to using an original i line, or g line increase. And, similarly, using spin coat technology, the resist material is deposited.

When the depositing of the resist material has ended, the line and space pattern etc is patterned into the resist material using exposure technology and resist pattern 17 is formed. At this time, the resist pattern is patterned at twice the pitch of the pitch demanded.

Figure 29:
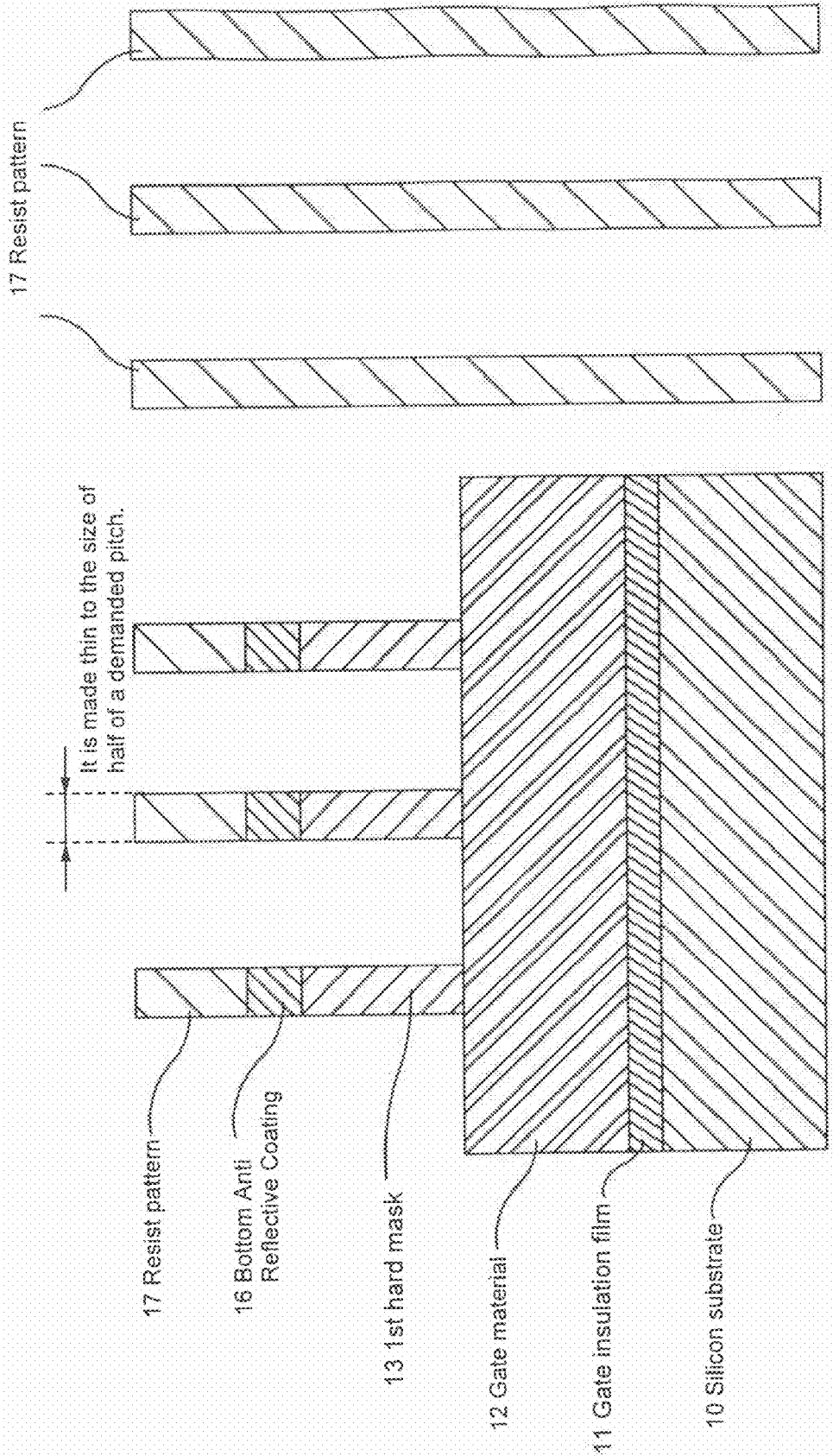
FIG. 29 is a construction diagram of a second process of the semiconductor device where a gate is formed using sidewall mask transfer technology.

Then, the resist pattern 17 is masked and using dry etching technology BARC 16 and a first hard mask 13 are processed. At the time of BARC 16 processing or first hard mask 13 processing, the BARC 16 or first hard mask 13 is narrowed (hereinafter referred to as slimming technology). Alternatively, after processing the first hard mask 13, by narrowing the size of the first hard mask 13 to a desired size by wet etching, the first mask 13 is slimmed to a pattern half of the demanded pitch (FIG. 29). The resist is removed after the first mask 13 processing by ashing technology.

Figure 30:
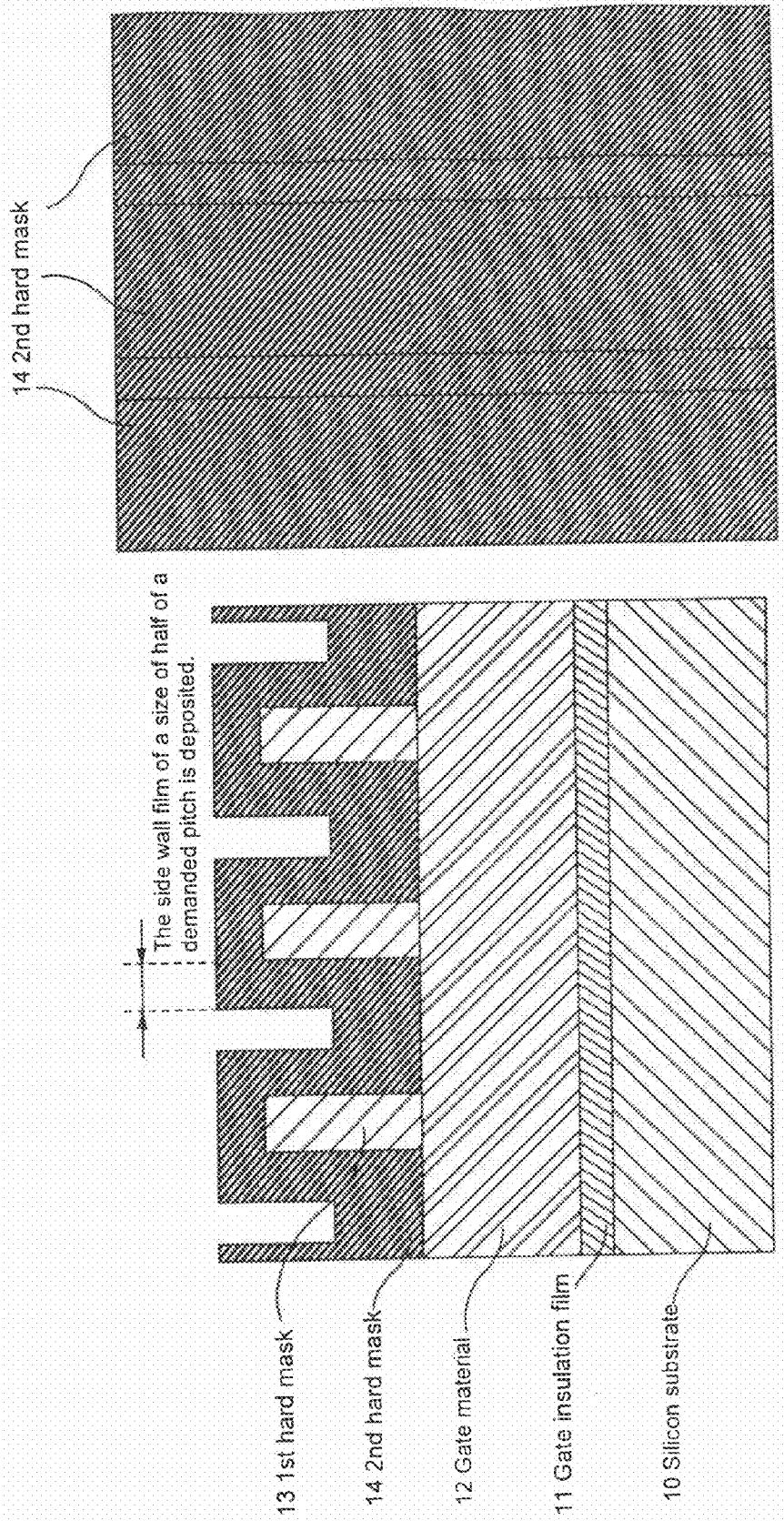
FIG. 30 is a construction diagram of a third process of the semiconductor device where a gate is formed using sidewall mask transfer technology.

A second hard mask 14 of $Si_3N_4$ etc is deposited on the first mask 13 which has been slimmed to about half the demanded pitch, using CVD technology. At this time, the film width of the deposited second hard mask 14 is about half the size of the demanded pitch (FIG. 30).

Figure 31:
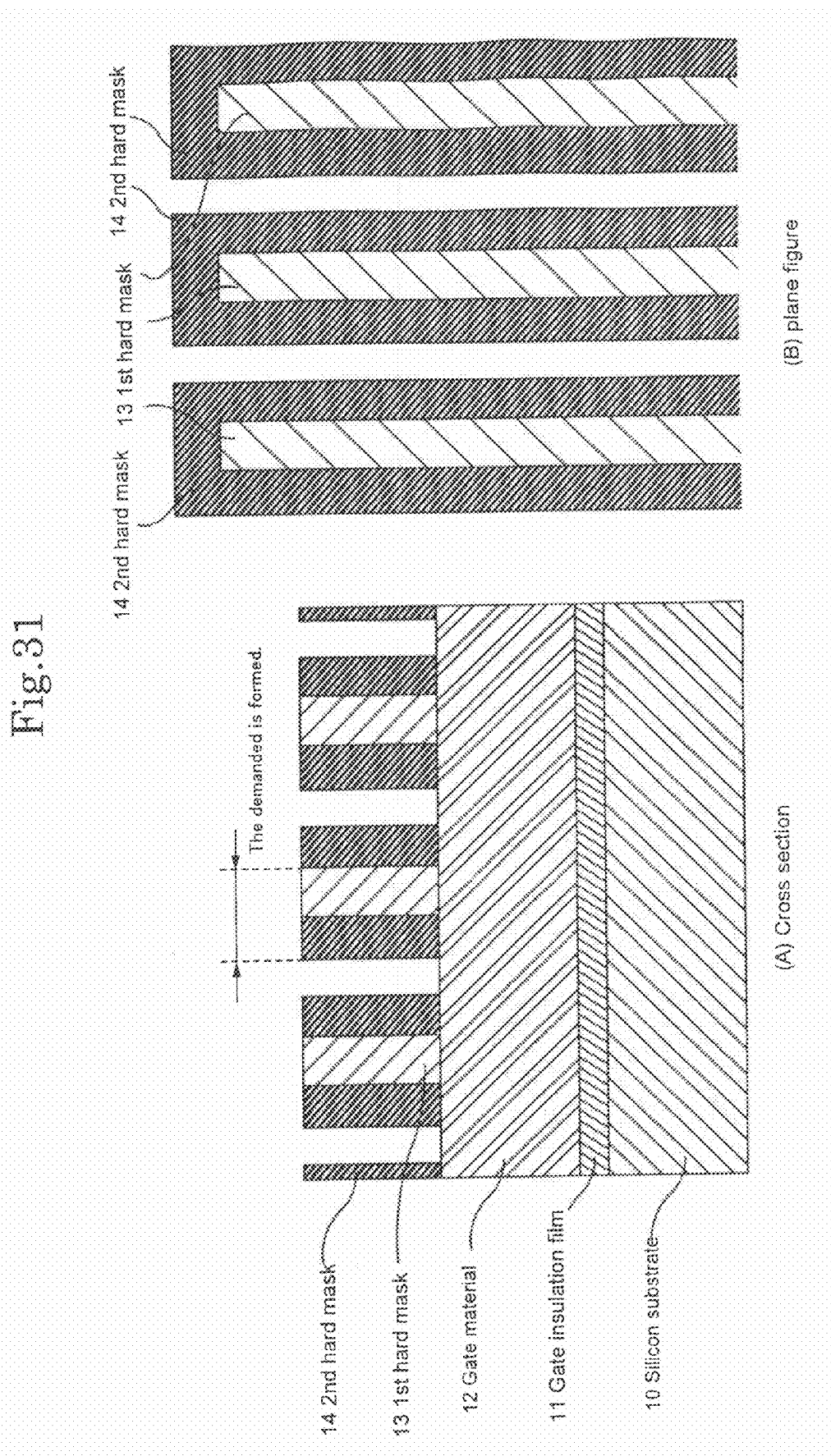
FIG. 31 is a construction diagram of a fourth process of the semiconductor device where a gate is formed using sidewall mask transfer technology.

Next, using dry etching technology, the second hard mask 14 is etched anisotropically until the surface of the first hard mask 13 is exposed. In this way, it becomes the mask composition where the second hard mask 14 is deposited on the sidewall of the first hard mask 13 (FIG. 31).

Next, the first hard mask 13 is selectively exfoliated. By the above processing method, it is possible to form a second hard mask 14 of a line and space pattern of the demanded pitch. However, the second hard mask 14 is formed in a circular shape by the joining of the end parts of two adjacent lines.

This second hard mask 14 is masked, the poly-silicon is dry etched and by exfoliating the second hard mask 14 it is possible to complete a gate material of the demanded pitch.

By using the technology stated above, even if the demanded design becomes strict, if it is possible to expose a pitch of twice the size of the demanded pitch, it is possible to form a line and space with the demanded pitch.

Figure 32:
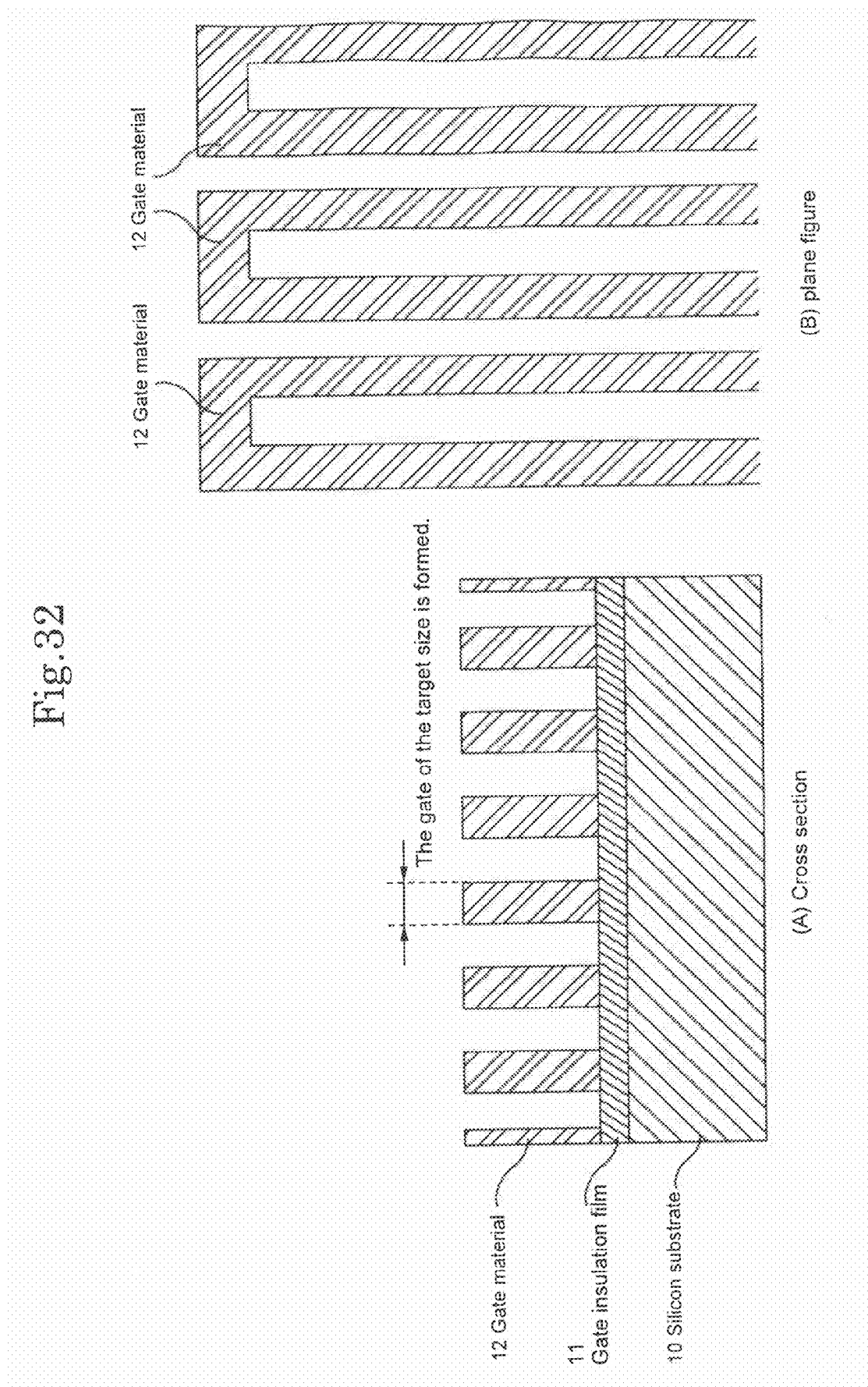
FIG. 32 is a construction diagram of a fifth process of the semiconductor device where a gate is formed using sidewall mask transfer technology.

However, in the case of forming a cell gate by side wall mask transfer technology, as shown in FIG. 32, the two adjacent gate materials 12 are formed by the gate end connected to the cell gate. Therefore, after forming the cell gate of the demanded pitch, the gate end is processed and a process to form two object cell gates is required.

Figure 33:
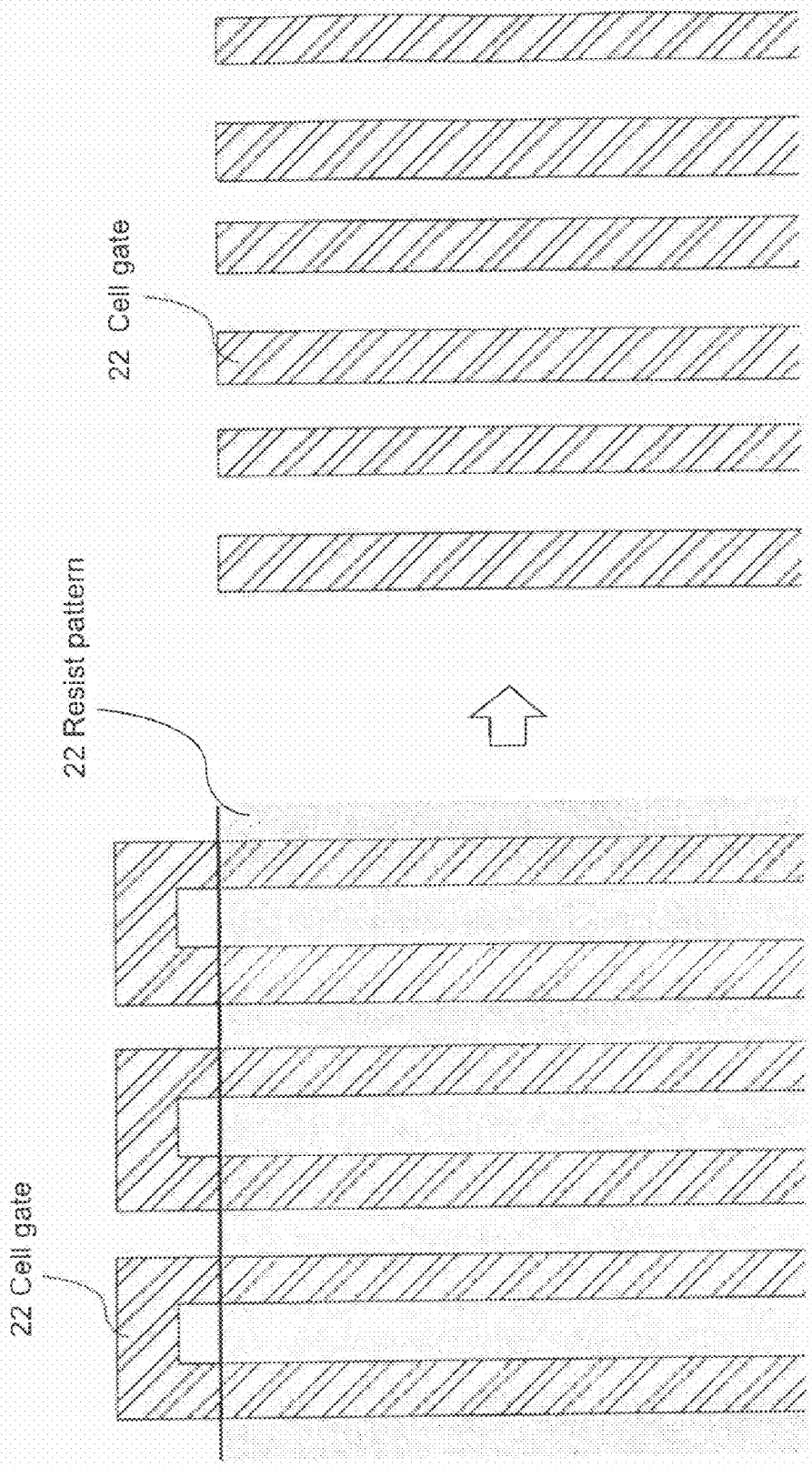
FIG. 33 is a patterned view showing the formation of a general gate where a gate is formed using sidewall mask transfer technology.

FIG. 33 is a pattern view which shows the formation of a general gate where a gate is formed using sidewall mask transfer technology. As shown in FIG. 33, on the two cell gates 22 connected to the gate end formed in the processing shown in FIG. 32, a resist pattern 17 is formed so that the part desired to be left is covered. Next, the resist pattern is masked and by etching, the cell gate 22 is processed so that the cell gate end becomes open. Therefore, the process of processing increases.

Figure 34:
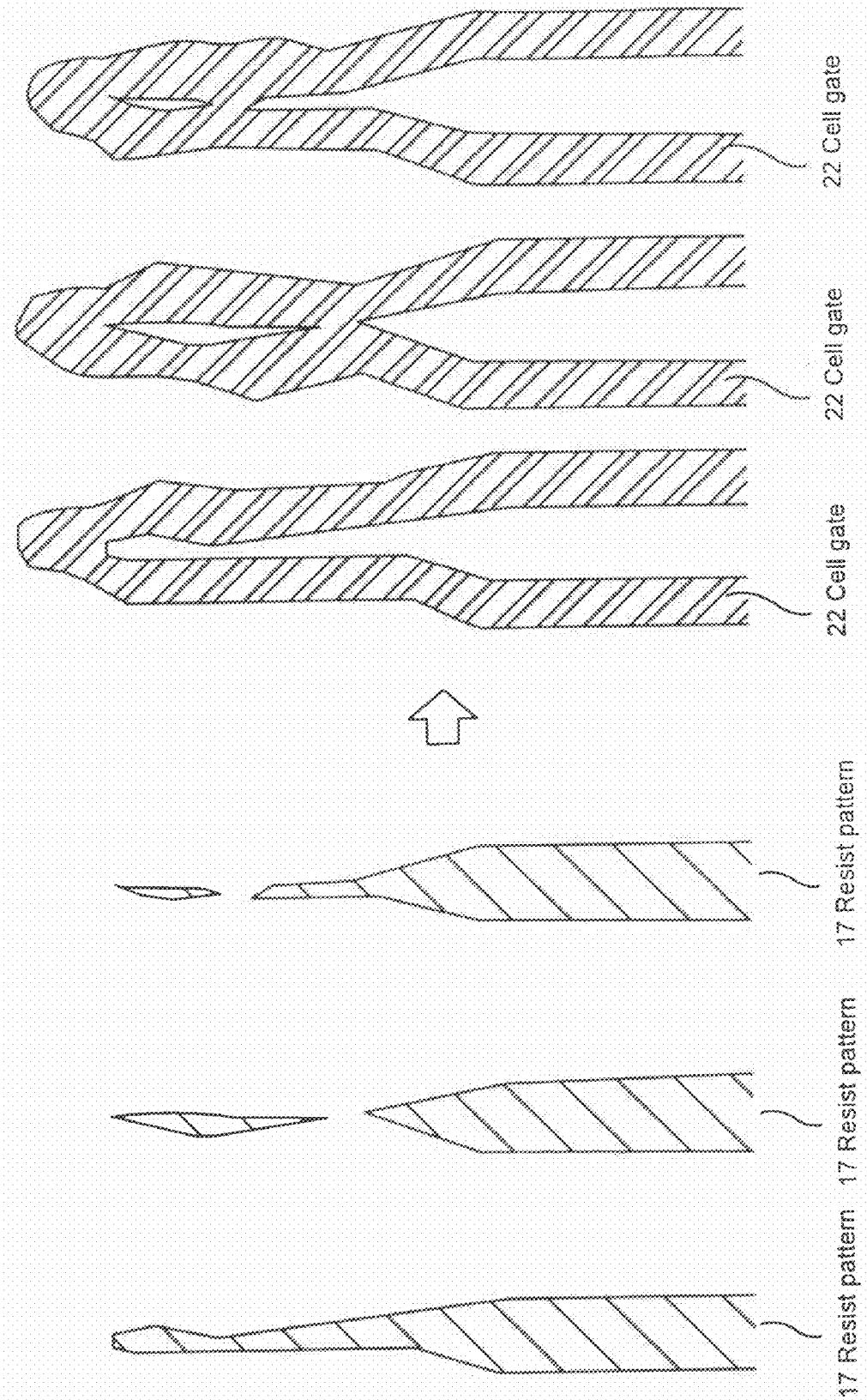
FIG. 34 is a patterned view showing the narrowing and shorting of the space of the gate end in the formation of a general gate where a gate is formed using sidewall mask transfer technology.

Also, when forming a line using sidewall mask transfer technology, actually, the space in the end of the cell gate processed to become open, could become narrow or the two cell gates 22 could touch. FIG. 34 is a pattern view showing narrowing or shorting of the space at the gate end or shorting in the formation of a general gate in the case where a gate is formed using sidewall mask transfer technology.

The resist pattern 17 shown on the left side of FIG. 34 is the resist pattern 17 formed in the above stated FIGS. 28 and 29. As shown in FIG. 34, this resist pattern 17 itself may be narrow or break. When cell gate 22 is formed using sidewall mask transfer technology based on this pattern, the space between the two cell gates 22 may become narrow and even touch as shown on the right side of FIG. 34.

As stated above, the reasons for resist pattern 17 being narrow or breaking are as follows. That is to say, when processing a cell gate using sidewall mask transfer technology, as shown in FIG. 28 or FIG. 29, after the gate insulation 11 and gate material 12 which forms the cell gate 22 are laminated, it is coated with photoresist and the gate pattern is imprinted. At the time of imprinting the gate pattern, due to fluctuations in the exposure device or processing device, the remoter parts of the pattern are not accurately imprinted by the gate pattern and as a result the formed resist pattern 17 becomes narrow.

When forming a cell gate 22 by depositing the sidewall layer on the resist pattern 17 which may be narrow and break, the gate end of the formed cell gate itself is narrow and the two cell gates contact at the gate end, as shown on the right side of the FIG. 34. It becomes a cause which a short circuit generates.

In embodiment one of this invention, when forming a cell gate line etc using sidewall mask transfer technology, as well as proposing a semiconductor where awareness of the line narrowness or short effects is not needed, a method of forming a line which can remove line narrowness and short effects is proposed.

Figure 1:
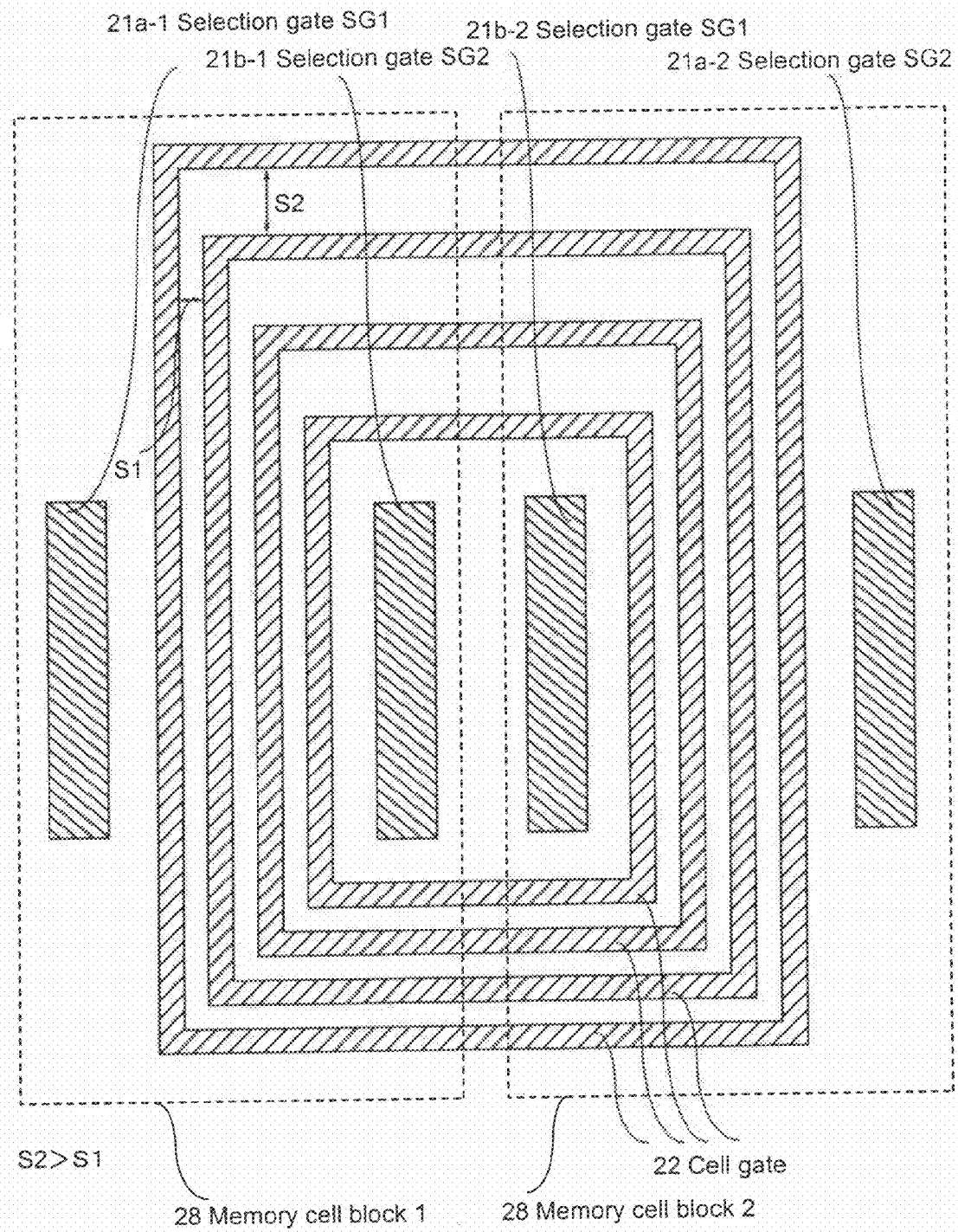
FIG. 1 is a horizontal view of the cell gate placement within the memory cell block of the semiconductor device related to embodiment one of this invention.

FIG. 1 is a horizontal view of the cell gate placement within the memory cell block of the semiconductor device related to embodiment one of this invention. The semiconductor device related to embodiment one of this invention has a cell gate of a of roughly rectangular closed loop placed between two selection gates within the memory cell block and two adjacent memory cell blocks which share the cell gate. While an example of a NAND type flash memory is shown in FIG. 1, the semiconductor device of embodiment one of this invention is not limited to this example. Also, FIG. 36 is an equivalent circuit diagram of the semiconductor device related to embodiment one of this invention shown in FIG. 1.

Figure 36:
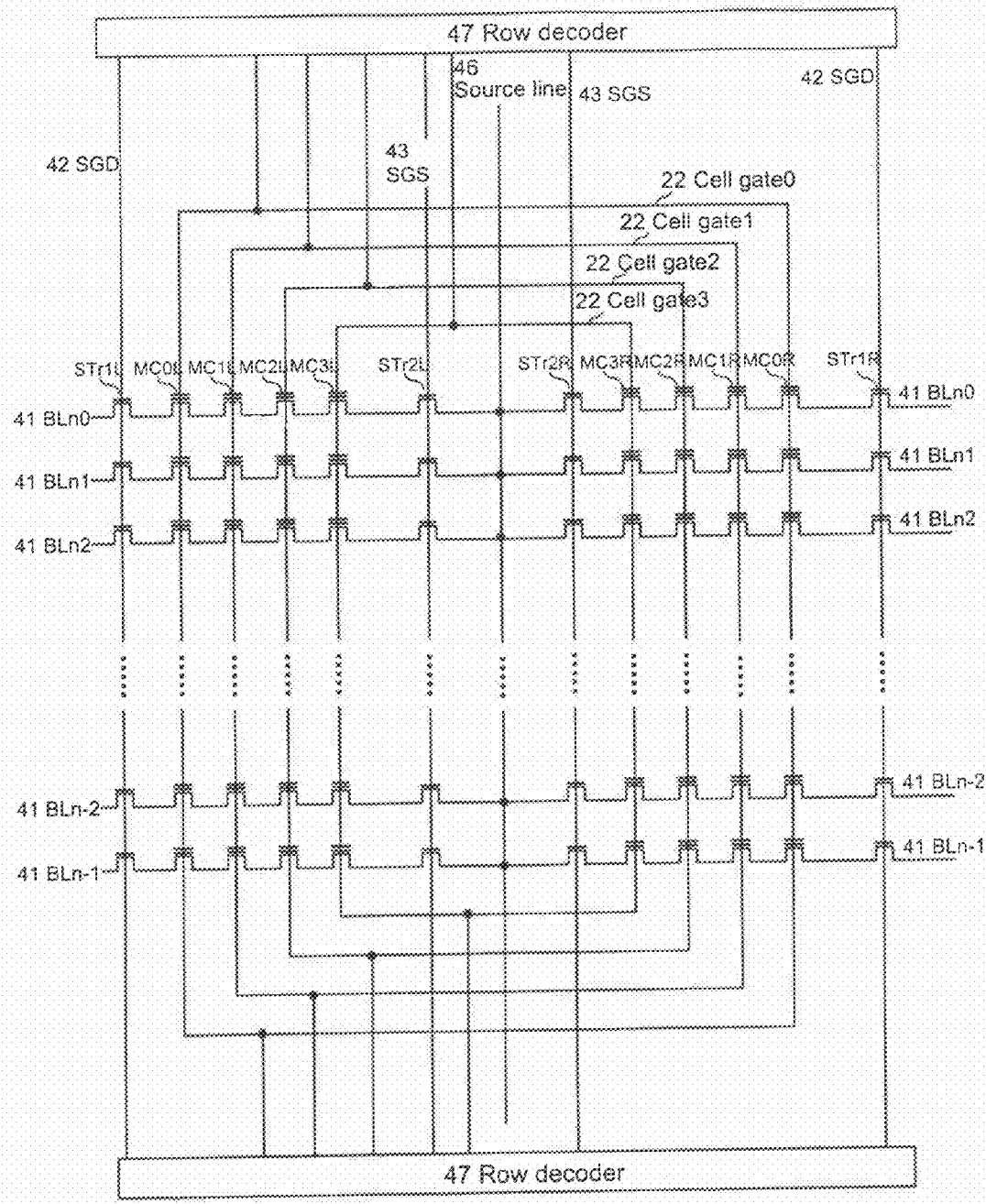
FIG. 36 is an equivalent circuit diagram of the semiconductor device related to embodiment one of this invention.

Next, an explanation based on FIG. 1 and FIG. 36 is given. In FIG. 1, two adjacent memory cell blocks 28 are placed in parallel. An example of a memory block 28 of a NAND type flash memory is shown in FIG. 1. The two memory cell blocks 28 each have two (a pair of) selection gates 21 (selection gate line).

Each NAND cell unit of the NAND type flash memory in FIG. 36 is constructed of a plurality of memory cells connected in series, one end is connected to a bit line BL4 through a selection gate transistor STr1 which is connected to a selection gate line SGD42, the other end is connected to a common source line 46 through a selection gate transistor STr42 which is connected to a selection gate line SGS43. The control gate of each memory cell is connected to cell gate 22 (cell gate 0 to cell gate 3). A plurality of memory cells which are connected to one cell gate 22 (a word line) is constructed as a page. Each cell gate 22 is extracted and connected to row decoder 47 through a transfer gate. By controlling the first and second selection gates SG1 (21a) and SG2 (21b) of FIG. 1, the memory cell block 28 which performs data program and read out is selected.

In FIG. 1 a cell gate 22 is placed between two (a pair of) selection gates 21. The selection gate 22 in the memory device related to embodiment one of this invention has a roughly rectangular closed loop, is placed abridge the two adjacent memory cell blocks 28 and the pair of selection gates are placed between the plurality of cell gates 22 in one of the memory blocks.

A cell gate 22 which corresponds to the number of memory cells connected to one NAND cell unit, is placed between the pair of selection gates 21. In FIG. 1, an example of the placement of four cell gates is shown. However, because they are placed corresponding to the number of memory cells connected to the NAND cell unit stated above, they are not limited to these drawings.

Here, in the semiconductor device related to embodiment one of this invention as stated above, the cell gate 22 has a roughly rectangular closed loop and is placed abridge the adjacent memory cell blocks 28. That is to say, as shown in FIG. 1, the four cell gates 22, are, at first, formed in a roughly rectangular closed loop so that they abridge the adjacent memory cell block 1 and memory cell block 2 (28). Of the two selection gates 21 of memory cell block 1 (28), the selection gate SG2 (21b-1) which is placed closest to the side of memory cell block 2 (28) and of the two selection gates 21 of memory cell block 2 (28), the selection gate SG2 (21b-2) which is placed closest to the side of memory cell block 1 (28) are formed by being placed within the cell gate 22 which has the roughly rectangular closed loop and is surrounded by cell gate 22.

Figure 2:
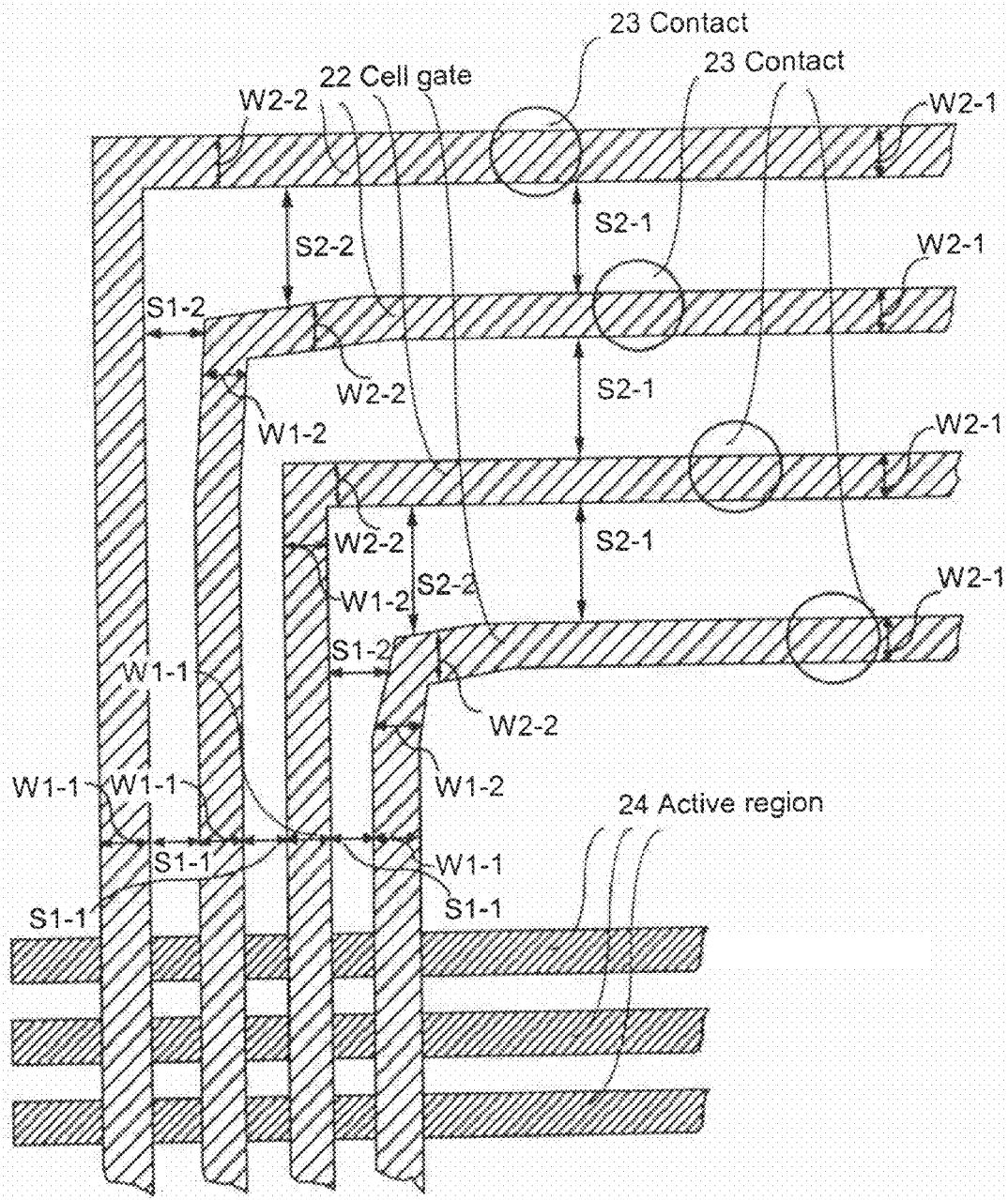
FIG. 2 is an enlarged patterned view of the left side upper corner of the roughly rectangular closed loop cell gate within the semiconductor device related to embodiment one of this invention.

Also, in the semiconductor device related to embodiment one of this invention, the plurality of cell gates which have a roughly rectangular closed loop are set so that in one area of the four areas of the rectangle the distance between the adjacent cell gates is wide. FIG. 2 is an enlarged pattern view of the left upper corner of the four cornered roughly rectangular closed loop cell gate of the semiconductor device related to embodiment one shown in FIG. 1.

In FIG. 1, the plurality of cell gates 22, which are formed into a roughly rectangular closed loop and abridge the two memory cell blocks, memory cell block 1 (28) and memory cell block 2 (28), are set so that the gap between the upper part of the area which is perpendicular to the area arranged between the corresponding selection gate 21 amongst the four areas which have a roughly rectangular closed loop becomes wider. Hereinafter, the four areas which constitute the roughly rectangular closed loop may be called "line", respectively. More concretely, the adjacent cell gate gap S1 of the area which is parallel to the corresponding selection gate 21 in FIG. 1 and the adjacent cell gate gap S2 of the upper area of the area which is perpendicular to the corresponding selection gate 21 is different in size, S2>S1 and the gap within the adjacent cell gate 22 in the upper area is set widely. The adjacent gap S1 of the area which is perpendicular to the active region 24 in FIG. 2 and the adjacent gap S2 of the area which is parallel to the active region 24 is also S2>S1.

Together with the miniaturization of the line and space, the miniaturization of the contact formation when arranging a contact on the gate is also demanded. However, the current miniaturization technology of contact formation is not catching up with the miniaturization technology of the line and space and the contact's predetermined position or size can sometimes be slightly misaligned. Because products whose predetermined position and size are misaligned are bad products there is a manufacture loss. Therefore, when arranging a contact in cell gate 22, a contact adjustment margin so there are no effects even when there is a slight misalignment, is being demanded.

As shown in FIG. 1 and FIG. 2 in embodiment one of this invention, the cell gate 22 which has a roughly rectangular closed loop is set so that the adjacent cell gate gap of the upper part of the area which is perpendicular to the corresponding selection gate 21 becomes wide. Therefore, by arranging a contact in this part it is possible to secure the adjustment margin and reduce manufacture loss.

Also, generally, because the cell gate is placed in a direct line between the selection gates the contact is arranged on the cell gate which is placed between the selection gates. A plurality of cell gates are placed within the selection gate, however, for example, if 32 memory cells are connected to a NAND cell unit then 32 cell gates will be placed in a very small gap. It is not easy to arrange a contact in a predetermined position in this very small gap while securing an adjustment margin. If miniaturization continues to progress, it will become more difficult to arrange a contact while securing an adjustment margin.

In the semiconductor device related to embodiment one of this invention, a contact is arranged on a cell gate which is placed in a perpendicular direction to the corresponding selection gate. As stated above, the semiconductor device related to embodiment one of this invention has a plurality of roughly rectangular closed loop cell gates wherein this plurality of roughly rectangular closed loop cell gates are set so that the adjacent cell gate gap in one area of the area which is perpendicular to the corresponding selection gate is wide. Therefore, if a contact is arranged on this cell gate area it is possible to arrange a contact while securing an adjustment margin.

As a result of this, in the semiconductor device related to embodiment one of this invention, it is possible to easily arrange a contact with a contact adjustment margin, and respond to the progress of miniaturization.

Figure 6:
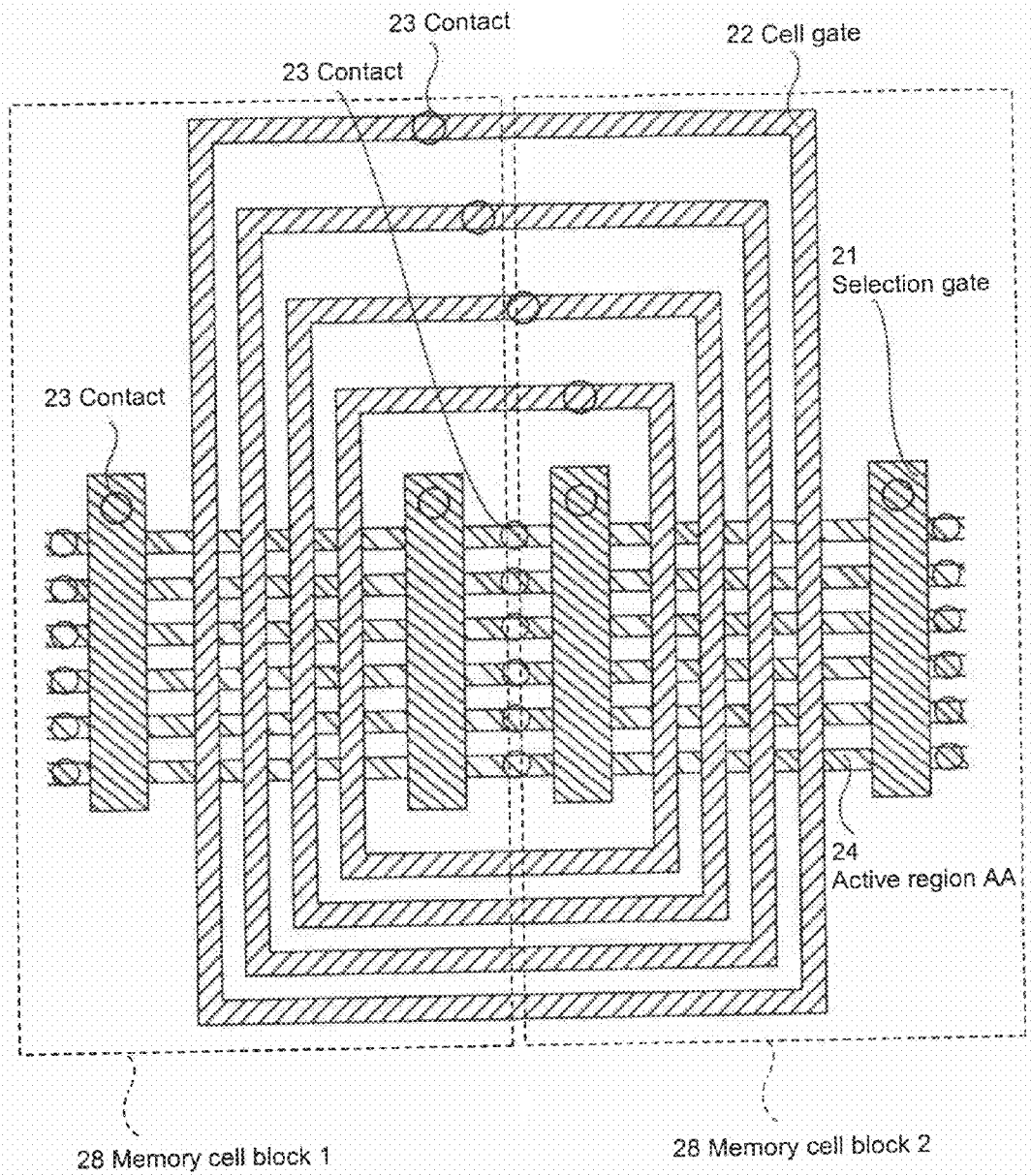
FIG. 6 is a horizontal view which shows the placement of the contact of the semiconductor device related to embodiment one of this invention.

FIG. 6 is a horizontal view showing the placement of a contact in the semiconductor device related to embodiment one of this invention. As shown in FIG. 6, a plurality of cell gates 22 are placed abridge two memory cell blocks 28. The cell gate 22 has a roughly rectangular closed loop and the adjacent cell gate gap in the upper area of the cell gate which is perpendicular to the corresponding selection gate 21 is set widely. A contact 23 is arranged on the cell gate 22 and selection gate 21 and a wire is connected. Also, a contact is arranged in the active region AA24 and a wire is connected.

In the semiconductor device related to embodiment one of this invention shown in FIG. 6, the contact 23 of the cell gate 22 is arranged in the upper area which is perpendicular to the corresponding selection gate 21 and where the adjacent cell gate area is set wide among the four areas which have a roughly rectangular closed loop. Because the adjacent cell gate gap is wide, it is possible to easily secure a sufficient contact adjustment margin and to arrange a contact 23 in this upper part area. Alternatively, the adjacent cell gate gap is narrow in the two area's which is in a parallel direction to the corresponding selection gate 21 of the plurality of cell gates 22 which have a roughly rectangular closed loop. Therefore, miniaturization progresses and the more the number of placed cell gates 22 increases the narrower the gap becomes and arranging a contact 23 in these two areas becomes more difficult. According to embodiment one of this invention, because a contact is not arranged in the two areas which are in a parallel direction with this selection gate 21, it becomes possible to respond to the progression of miniaturization.

Further, in FIG. 1 and FIG. 2, the upper part area of the cell gate 22 which is perpendicular to the corresponding selection gate 21 is made to be the area where the adjacent cell gate gap becomes wide among the four areas of the cell gate 22 which has a roughly rectangular closed loop. However, it is not limited to this. It is not shown in the diagrams but the lower part area of the cell gate 22 which has a roughly rectangular closed loop and which runs perpendicular to the corresponding selection gate can be made the area where the adjacent cell gate gap becomes wide. Also, the area where the adjacent cell gate gap becomes wide is not limited to one of the four areas of the cell gate which has a roughly rectangular closed loop. It is possible to make two areas wide which run perpendicular to the corresponding selection gate. Therefore, it is possible to arrange and disperse contacts in the two areas and desired circuit design can be easily obtained.

As a result, it is not shown in the diagram but in the semiconductor device related to embodiment one of this invention, it is possible to widen the adjacent cell gate gap in either of the two areas which run perpendicular to the corresponding selection gate among the four areas of the cell gate which have a roughly rectangular closed loop. Therefore, the contact arranged on the cell gate can be arranged in the upper part area where the adjacent cell gate gap has been widened or it can be arranged in the lower part area where the adjacent cell gate gap has been widened and it can be distributed and arranged in both upper and lower part areas where the adjacent cell gate gap has been widened. Because the adjacent cell gate gap is set widely in advance, whichever position the contact is arranged in, it is possible to easily secure an adjustment margin and respond to the progress of memory miniaturization.

The manufacturing method which forms the roughly rectangular closed loop cell gate stated above will be explained. The semiconductor device of embodiment one of this invention forms a line and space by sidewall mask transfer technology.

The FIGS. 7 to 11 are cross sectional views which show the manufacturing process of the memory cell block of the semiconductor device related to embodiment one of this invention. In each drawing the parts particularly related to the cell gate and selection gate are shown. Also, FIGS. 12 to 15 are horizontal views which show the formation of the mask pattern of the sidewall mask transfer technology in embodiment one of this invention and a diagram which explains the formation process of the mask pattern which fulfills an important role in the manufacturing process of the semiconductor device related to embodiment one of this invention which used sidewall mask transfer technology.

Firstly, on the semiconductor substrate, a tunnel insulation layer and a floating gate electrode layer are formed in series (not shown in the diagram). Next, the semiconductor substrate, the tunnel insulation layer and the floating gate electrode layer are patterned and a plurality of element areas (p-well) and a shallow trench isolation which are extended in the direction of a bit line are formed (not shown in the diagram). Next, an isolator is formed in the shallow trench isolation and a shallow isolation area is formed (not shown in the diagram). Further, an electrode insulation layer and control gate electrode layer are formed in series (not shown in the diagram). In this way, the substrate area is formed. In this way, the formed substrate is processed and the cell gate and selection gate can be formed. In FIGS. 7 to 11, the substrate area is simply explained.

Figure 7:
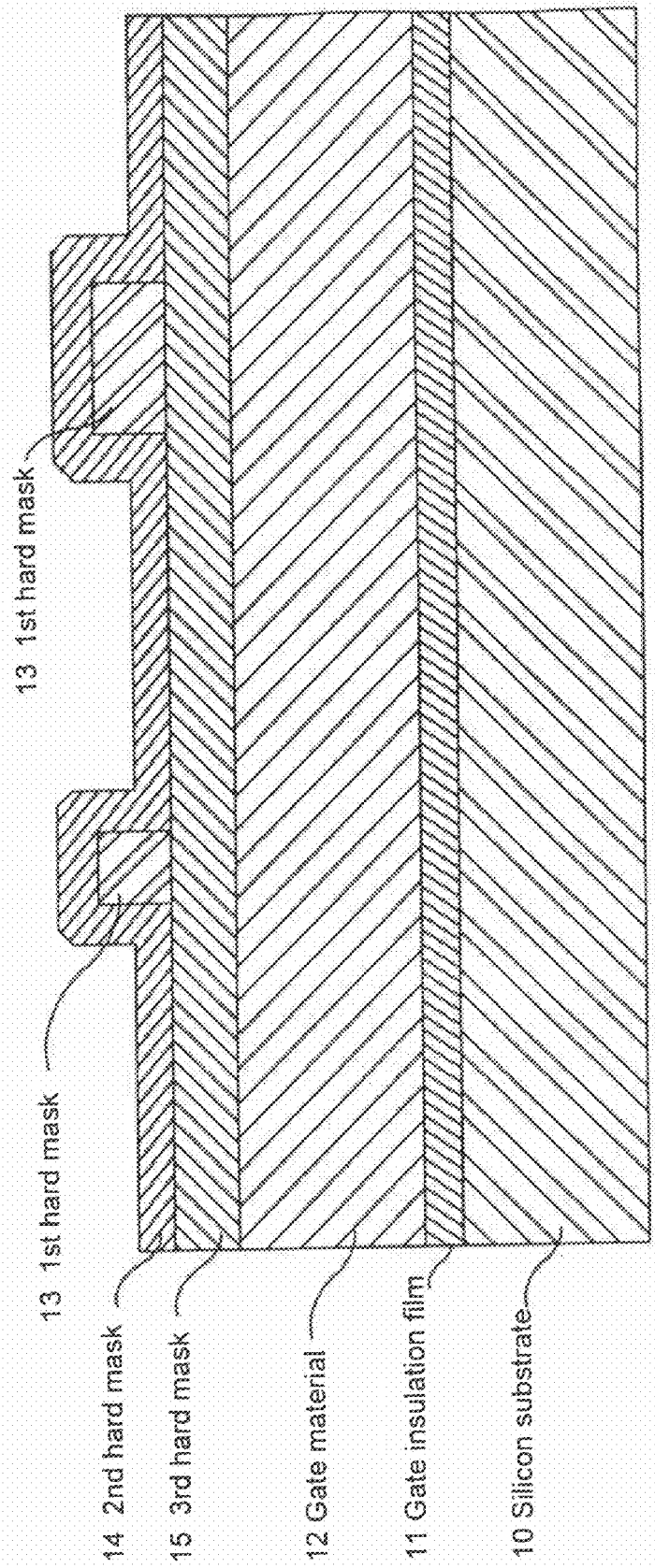
FIG. 7 is a cross sectional view which shows a first manufacturing process of the semiconductor device related to embodiment one of this invention.

In FIG. 7, a gate insulation layer 11 of a silicon oxide film etc is deposited on the silicon substrate 10 by thermal oxide processing. Further, the gate wire material layer 12 which is made from silicon etc (herein poly-silicon layer) is deposited on the gate insulation layer 11 using CVD technology.

Next, as an oxide silicon layer, $SiO_2$ is deposited on the gate wire material poly-silicon layer 12 using CVD technology to make a third hard mask 15 for processing the gate.

The first hard mask 13 which becomes the base using sidewall mask transfer technology is deposited using amorphous silicon by widely known CVD technology and an amorphous silicon layer is formed.

Further, in order to form the cell gate or selection gate pattern a resist is deposited using spin coat technology (not shown in the diagram).

When the accumulation of resist has ended, using exposure technology, a line and space pattern of the cell gate and selection gate will be patterned on the resist. The line and space pattern is formed into a roughly rectangular closed loop. At this time, the resist formed is lithographed by twice the pitch 2P of the demanded pitch P. Here, pitch P refers to the overall length of the space S to the formed cell gate line width W and adjacent cell gate. Therefore, P=W+S, and the resist pattern is formed by 2P=2(W+S)=2W+2S.

Here, when forming the semiconductor device related to embodiment one of this invention, in the two areas which are placed in the corresponding selection gate among the four areas of the cell gate which has a roughly rectangular closed loop and are formed last, the space S to the line width W and adjacent cell gate is set as small as possible due to miniaturization. In the other two areas of the cell gate which are formed last and have a roughly rectangular closed loop, the line width W and space S which become pitch P=W+S do not need to be set so small. In line with the design of the contact formation etc, space S is easily arranged in a gap.

Figure 12:
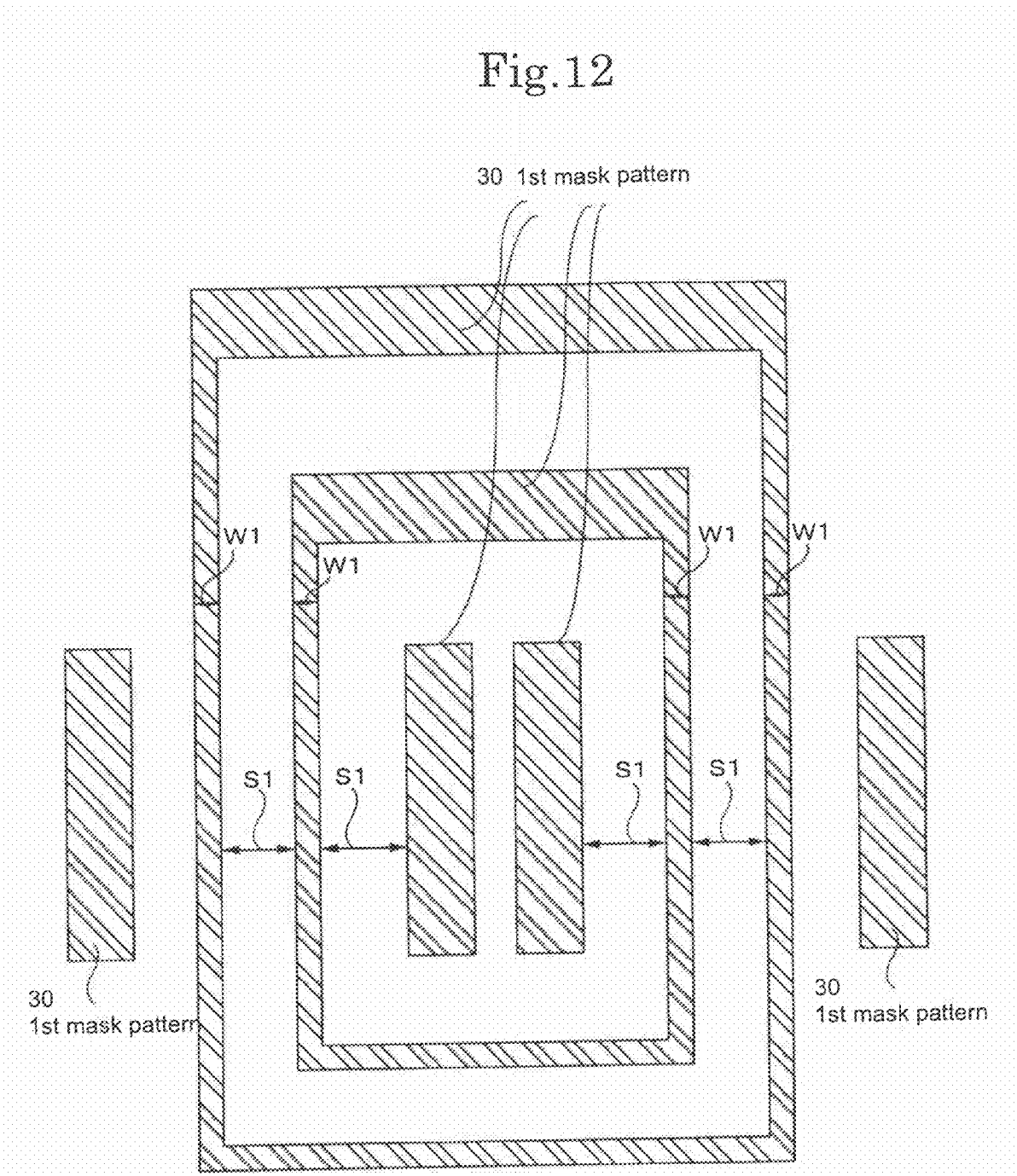
FIG. 12 is a horizontal view which shows the formation of a first mask pattern of the side wall mask transfer technology in embodiment one of this invention.

Then, the resist pattern of a roughly rectangular closed loop is made into a mask and the first hard mask 13 is processed using dry etching technology. Using ashing technology, the resist pattern is removed and the first hard mask 13 is narrowed to a pattern about half the size of the line width W (final desired space width S=W1). The mask pattern formed by this process is the first mask pattern shown in FIG. 12. In FIG. 12, in order to form the two areas placed in the corresponding selection gate among the four areas of the cell gate which are formed last and have a roughly rectangular closed loop, the line width W1 of the two areas which run parallel to the corresponding selection gate which is formed last among the four areas of first mask pattern 30. The resist pattern which is formed at first twice the size, is slimmed and the line width W is formed to the same size as the space S of the cell gate which is formed last.

Second hard mask 14 is deposited using $Si_3N_4$ on the first hard mask 13 which was patterned to width W1, (=the demanded space S) by the widely known CVD technology. $Si_3N_4$ is deposited so that the layer thickness of the demanded the second hard mask 14 becomes the same as the width W of the demanded line. This situation is shown in the cross sectional view in FIG. 7.

In the present embodiment, the first hard mask uses an amorphous silicon layer, the second hard mask uses a silicon nitride layer and the third hard mask uses a thermal silicon layer but it is not limited to this. What is necessary is simply a film which can mutually secure and etch a selection ratio.

Figure 8:
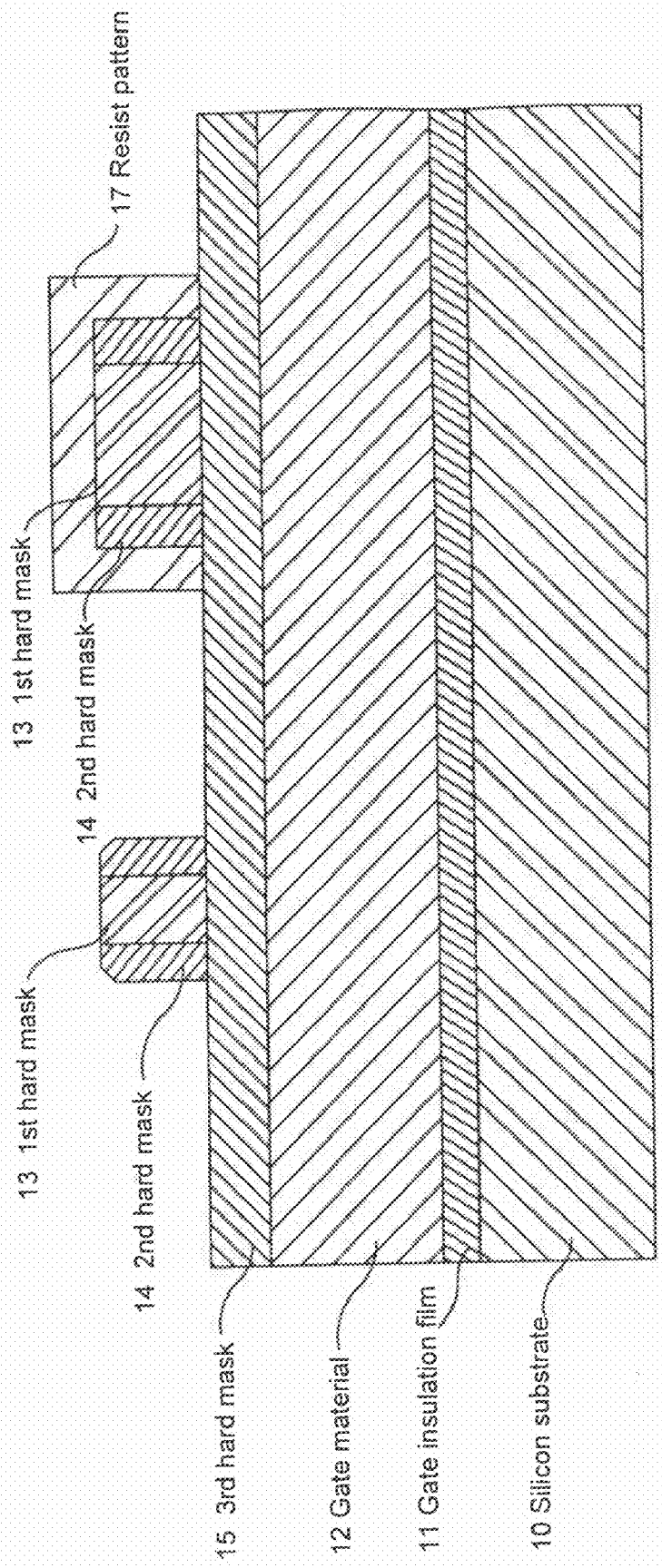
FIG. 8 is a cross sectional view which shows a second manufacturing process of the semiconductor device related to embodiment one of this invention
Figure 9:
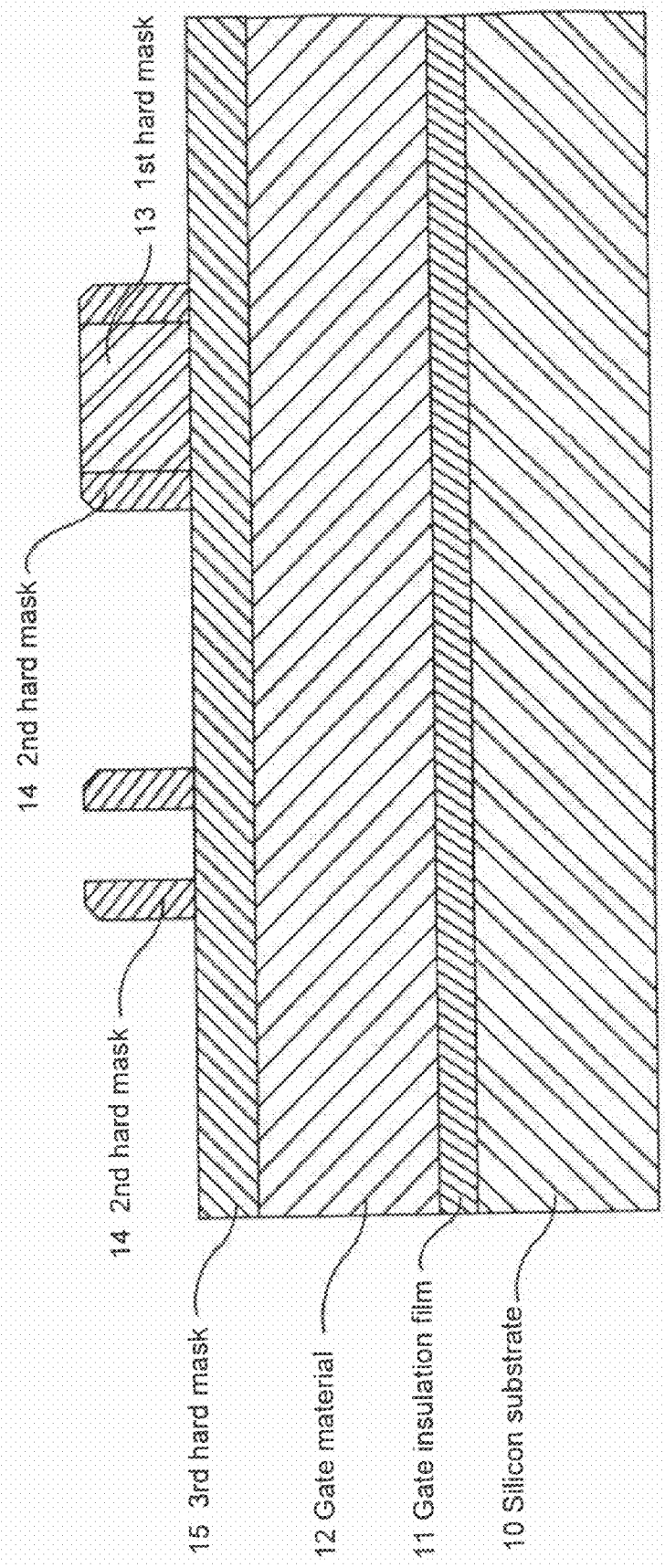
FIG. 9 is a cross sectional view which shows a third manufacturing process of the semiconductor device related to embodiment one of this invention.

After depositing the second hard mask 14, the second hard mask 14 is etched anisotropically by dry etching using a $C_xF_y$ gas similar to $CF_4$ or $CHF_3$ or a main gas such as $C_xH_xF_x$, and only first hard mask 13 and the sidewall part of second hard mask 14, which was deposited on the sidewall of the first hard mask 13, remains (FIG. 8). The mask pattern formed by this process is the second mask pattern 31 shown in FIG. 13.

Next, the first hard mask 13 is selectively etched and exfoliated by Chemical Dry Etching (hereinafter referred to as CDE) using a gas such as $CF_4$, $SF_6$ and $NF_3$, or Reactive Ion Etching (hereinafter referred to as RIE) (FIG. 9) having selectivity upon the second hard mask 14 and third hard mask 15. At this time, as shown in FIG. 8, the part of first hard mask 13 which is desired to be left is covered in advance with a resist pattern 17 and after the etching, by removing the resist pattern 17 it is possible to leave this part of the first hard mask 13.

Figure 14:
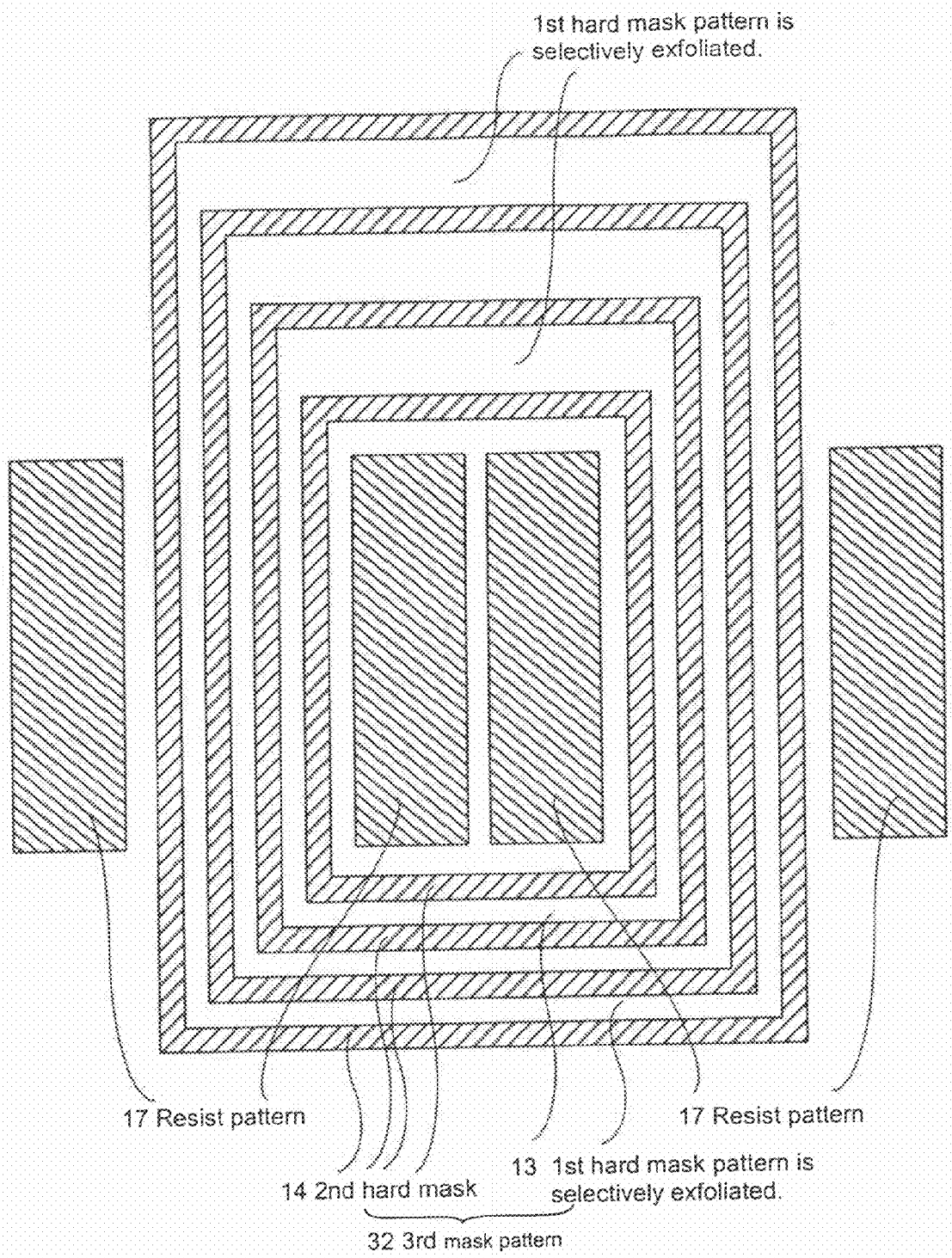
FIG. 14 is a horizontal view which shows the formation of a third mask pattern of the side wall mask technology in embodiment one of this invention.
Figure 15:
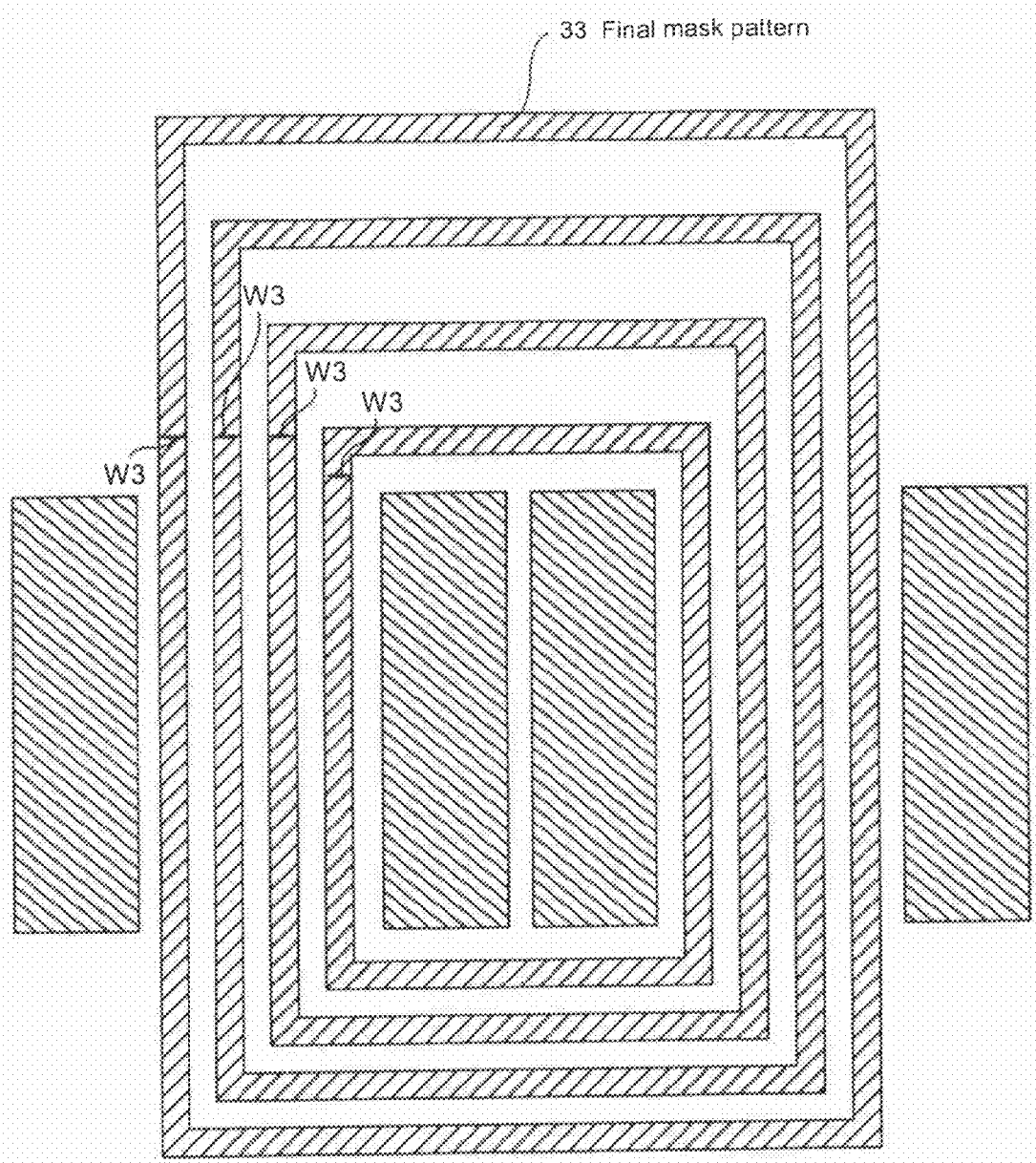
FIG. 15 is a horizontal view which shows the formation of a last mask pattern of the side wall mask transfer technology in embodiment one of this invention

The mask pattern which is formed by this process is the third mask pattern 32 shown in FIG. 14. FIG. 14 represents the third hard mask 32 in the case where the first hard mask 13 is left after the part which forms the selection gate 21 and the first hard mask 13 is covered with a resist pattern 17. Therefore, although it is not possible to show in FIG. 14, the part which forms the selection gate 21 is not exfoliated by first hard mask 13 but left under the resist pattern 17.

Figure 13:
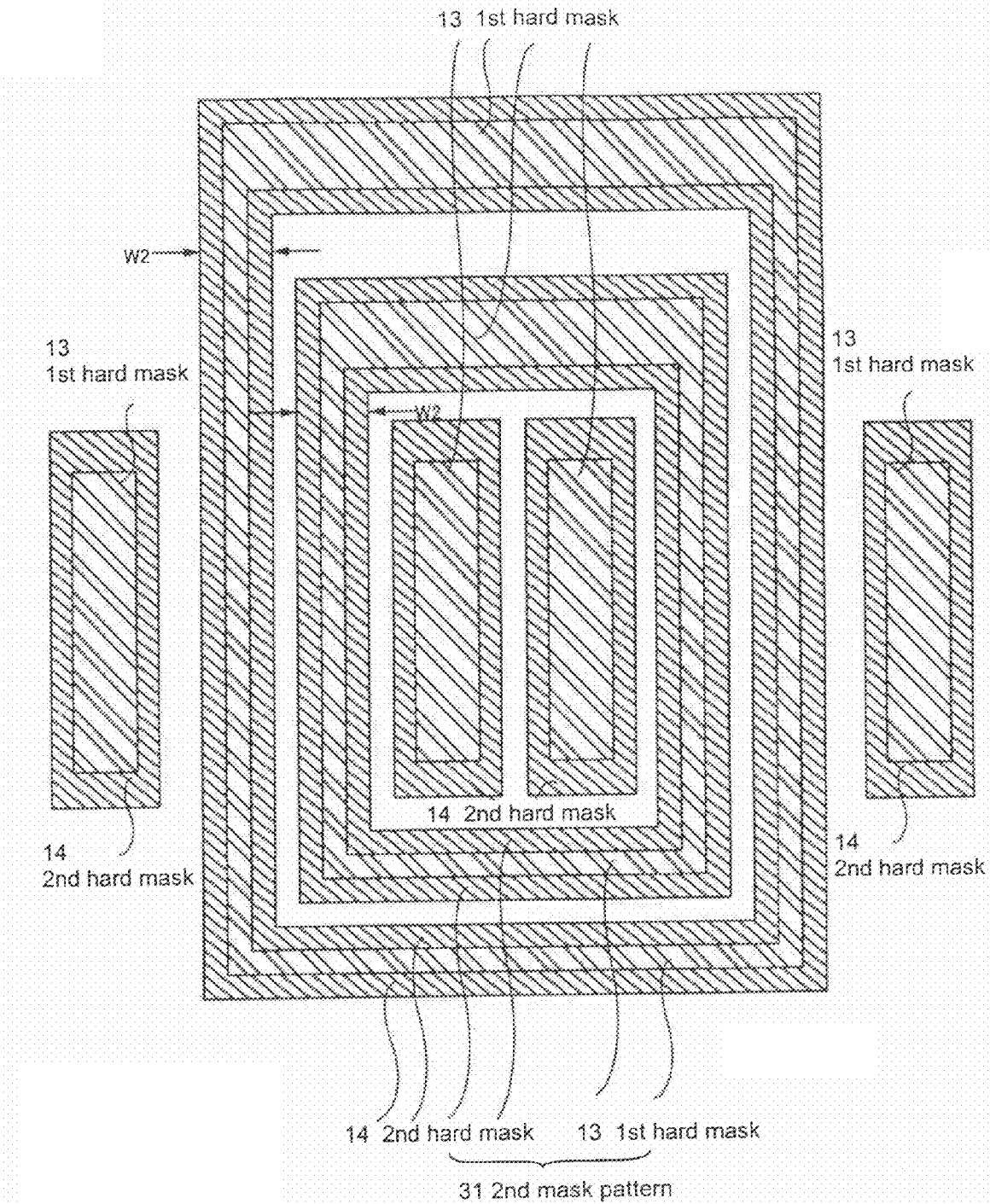
FIG. 13 is a horizontal view which shows the formation of a second mask pattern of the side wall mask transfer technology in embodiment one of this invention.

The line width W2 of the area which is parallel to the corresponding cell gate which is formed last of the second mask pattern 31 formed in FIG. 13 is 3W which is three times the width of the line width W of the cell gate formed last as stated above. As a result of line width W1 (=line W) of the first mask pattern 30 being exfoliated from the line width W2 of the second mask pattern 31 processed as shown in FIG. 14, two lines of the remaining third mask pattern 32 are formed, and a line with the demanded line width W equals line width W3. Therefore, in the third mask pattern 32, the line width W3 becomes the desired line width W. Also, the space S2 of the second mask pattern 32 is S2=2 (W+S)−3W and because in embodiment one of this invention W=S, S2=2S−W=S, the desired space S is formed.

Figure 10:
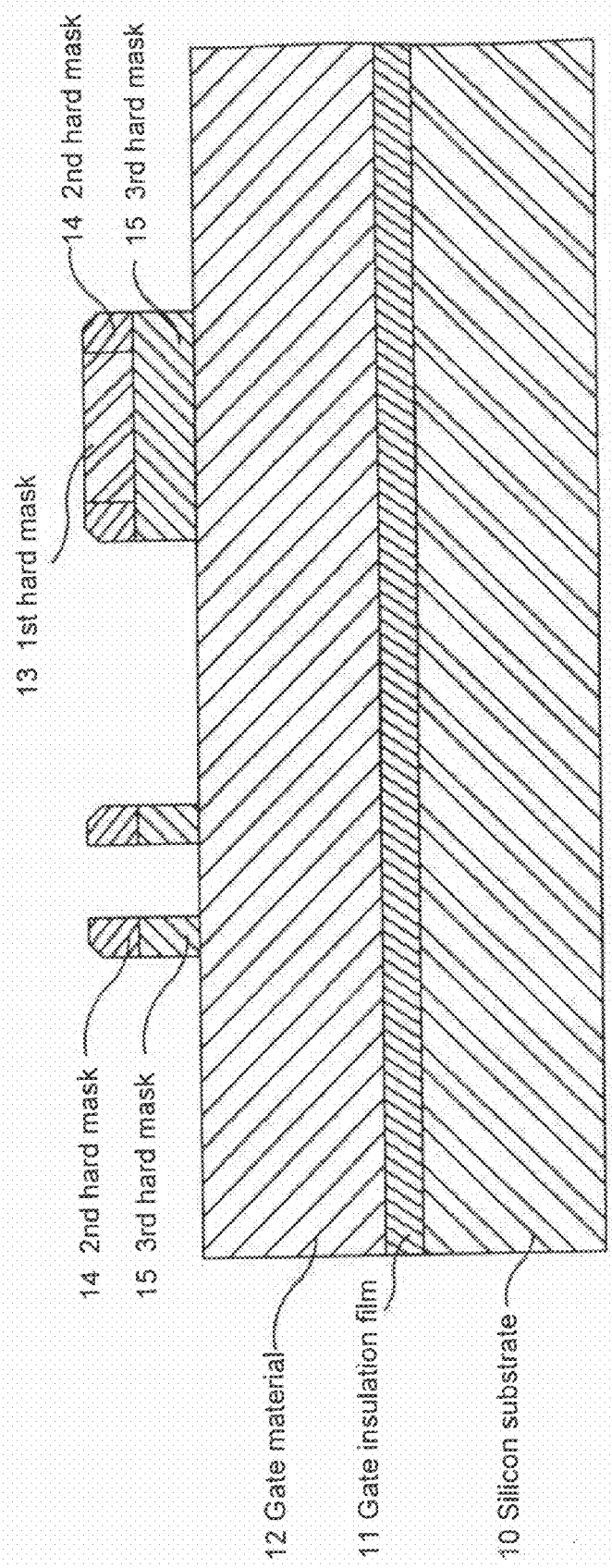
FIG. 10 is a cross sectional view which shows a fourth manufacturing process of the semiconductor device related to embodiment one of this invention.

Then, the second hard mask 14 and the remaining first hard mask 13 are masked and the third hard mask 15 is anisotropically dry etched with a main gas $C_xF_y$ gas or $C_xH_yF_z$ gas such as $CF_4$ or $CHF_3$ and the final predetermined mask is formed (FIG. 10). The mask pattern which is formed by this process is the final mask pattern 33 shown in FIG. 15. Because the line width and space formed by third mask pattern 33 is reflected as it is, the predetermined shape of the line and space is formed by the final mask pattern 33 shown in FIG. 15.

Figure 11:
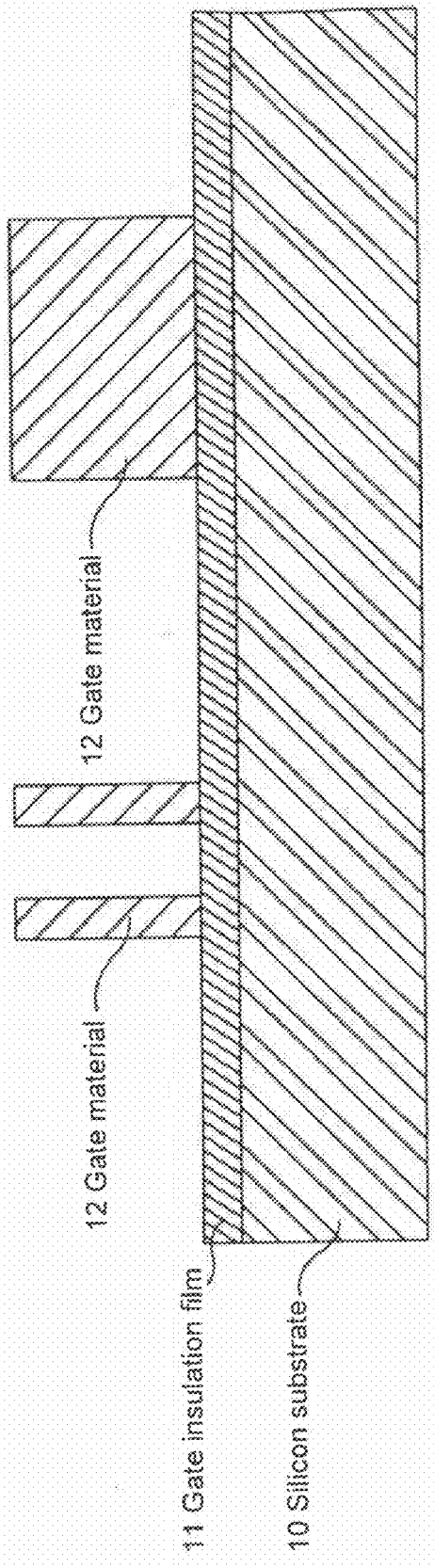
FIG. 11 is a cross sectional view which shows a fifth manufacturing process of the semiconductor device related to embodiment one of this invention.

This final third hard mask 15 is masked, the gate material 12 (here, a poly-silicon layer) is etched and the cell gate 22 and selection gate 21 are formed (FIG. 11). The semiconductor device related to embodiment one of this invention is manufactured by the method stated above. Further, in the manufacturing process the third hard mask 15 is used, however, without using the third hard mask pattern, the second hard mask 14 and the remaining first hard mask 13 are masked, the gate material 12 is etched directly and the cell gate 22 and the selection gate 21 can be formed.

The manufacturing process, which used sidewall mask transfer technology and a resist pattern as stated above, is applied in the example of the gate formation of the memory of the mechanism which selects the memory cell MC which performs program and read out by the selection gate and is already shown in FIG. 6.

In the semiconductor device shown in FIG. 6, by controlling a pair of selection gates 21 which are arranged in between the cell gates 22, the memory cell blocks 28, which are connected to the cell gate 22, are selected. Also, by controlling each cell gate 22 it is possible to perform data program and read out to the memory cell MC which is connected to each cell gate 22. However, as shown in FIG. 6, because the semiconductor device related to embodiment one of this invention is shared by two memory blocks 28 which adjoin cell gate 22 which has a roughly rectangular closed loop, if the selectivity of the operation of selection gate 21 is raised, there is a danger that an incorrect operation will arise in the cell which is not selected. Therefore, in order to prevent this incorrect program there is a need to devise a way to increase the size of the selection gate 21 and in the semiconductor device related to embodiment one of this invention the size of the selection gate 21 is set larger than usual. Also, in this type of memory, when performing erasure, each selection gate 21 is not controlled. Therefore, when using this type of circuit, simultaneous erasure of the two memory blocks is performed.

Because the cell gate of the semiconductor device related to embodiment one of this invention is formed by the process stated above, it has a roughly rectangular closed loop as shown in FIG. 1 and is formed in a way that it abridges two adjacent memory blocks. Moreover, because the line and space are formed simultaneously, the space S of the adjacent cell gate can be set widely in at least one area of the two areas which are perpendicular to the corresponding selection gate among the four areas of the cell gate which has a roughly rectangular closed loop.

Also, in the semiconductor device related to embodiment one of this invention, it is possible to easily secure a sufficient contact adjustment margin and arrange a contact on the cell gate and to respond to miniaturization.

Further, in the semiconductor device related to embodiment one of this invention, it is possible to form accurately and effectively a whole pattern which includes a line and space pattern or another pattern. Therefore, even if miniaturization progresses, it is possible to prevent narrowing of the line or generating of short circuits in the manufacture of the semiconductor device. Also, it is possible to omit the process of processing the cell gate end.

Further, in the semiconductor device related to embodiment one of this invention which is manufactured by the manufacturing process stated above, in order to prevent narrowing of the end of the resist pattern or breaking, the measures stated below are adopted in the manufacturing process. As a result, a plurality of cell gates which have a roughly rectangular closed loop of the semiconductor device, have a plurality of areas wherein a corner which is formed from more than two areas and the gap which is formed by the nth cell gate towards to the inner edge from the outer edge and (n+1)th cell gate (n is an odd number) is set so that it gradually becomes wider from a predetermined position heading towards the corner. FIG. 2 will be explained. Among the cell gates which have a roughly rectangular closed loop, the gap of the first and second cell gates from the outer edge and the gap of the third and fourth cell gates and the gap S between the gates of the area which is in a parallel direction to the corresponding selection gate (the area which runs in a vertical direction in FIG. 2) is the same gap S1-1 as the constant part from the center of the area but widens at the inner side from the constant part towards the left upper corner. Therefore, the gap S1-2 of the part near the corner is wider than the gap S1-1. Similarly, the gap S of the area of the gate which is perpendicular to the corresponding selection gate (the area which runs in a horizontal direction in FIG. 2) is the same gap as the constant part from the center part but widens at the inner side from the constant part towards the left upper corner and the gap of this part S2-2 is wider than the gap S2-1. As for the width of the cell gate, the width W1-1 of the area which runs parallel to the corresponding selection gate, the width W1-2 of the upper left part corner, the width W2-1 of the area which runs perpendicular to the corresponding selection gate and the width W2-2 of the upper left part corner are all approximately the same widths.

Figure 24:
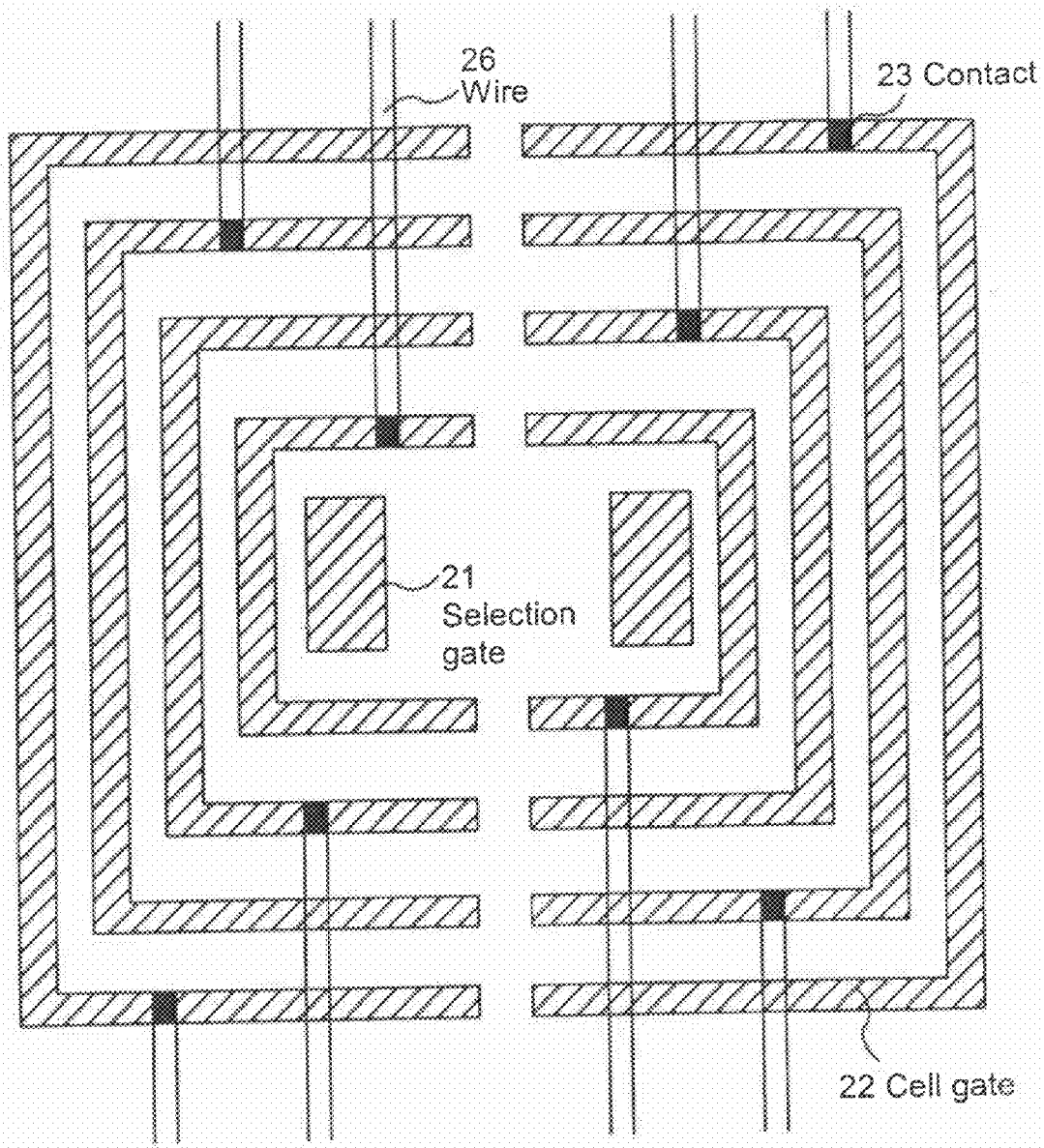
FIG. 24 is a horizontal view which shows a second example contact arrangement within the memory cell block of the semiconductor device related to embodiment one of this invention.

As stated above, in the case of forming a line and space using the sidewall mask transfer technology, narrowing of the gate end or breaking due to narrowing or breaking of the resist pattern as shown in FIG. 24 can sometimes occur. In embodiment one of this invention, by forming a cell gate with a roughly rectangular closed loop, narrowing and breaking of the end of the cell gate is suppressed. Further, in the corner part of the cell gate which has a roughly rectangular closed loop, an odd numbered adjacent cell gate gap from the outer edge towards the inner edge is set so that it gradually becomes wider from a predetermined position towards the corner to the inner edge. By this, it is possible to thoroughly suppress the narrowing and breaking and reduce manufacture costs.

Figure 3:
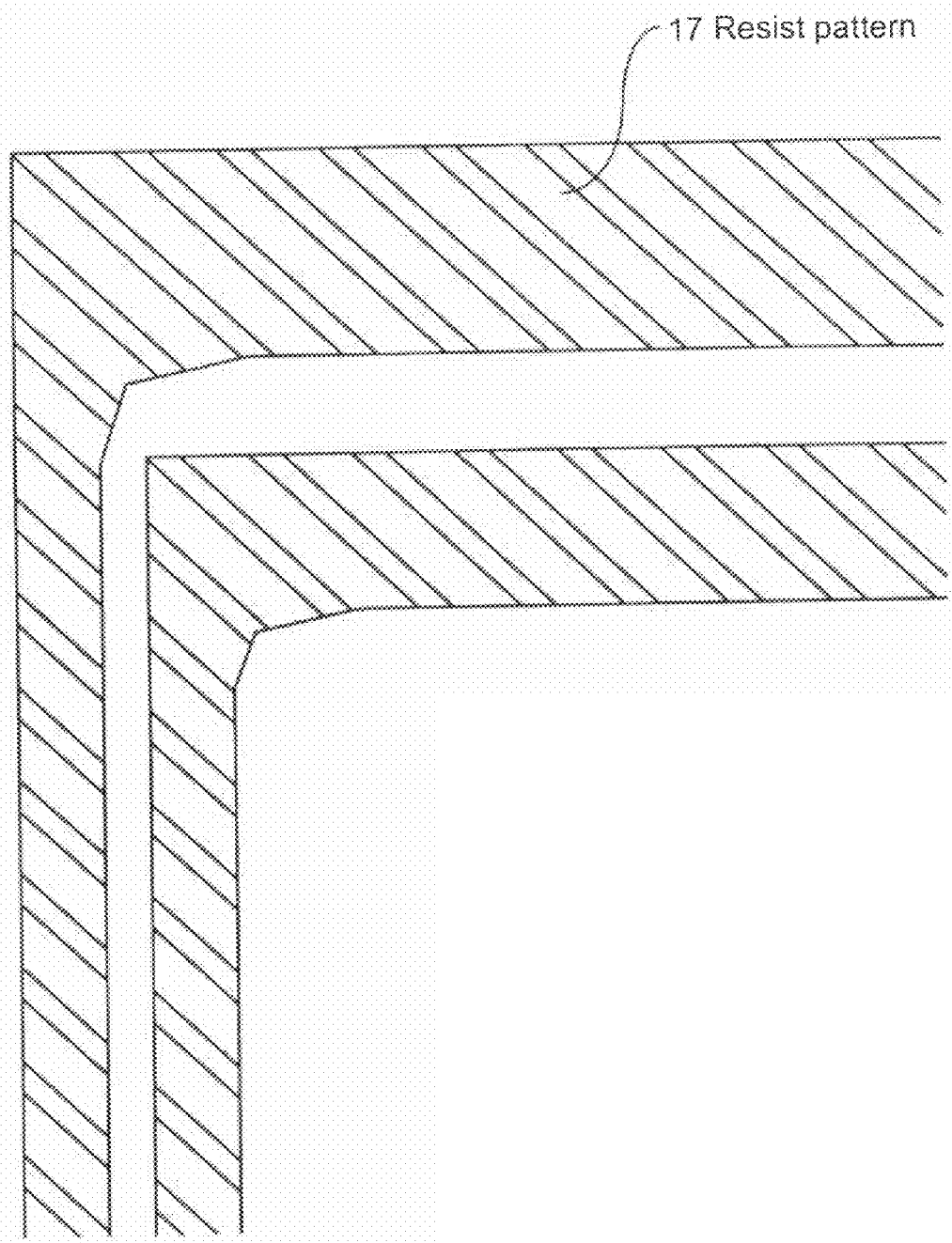
FIG. 3 is patterned view of a resist pattern formed by a manufacturing process.
Figure 4:
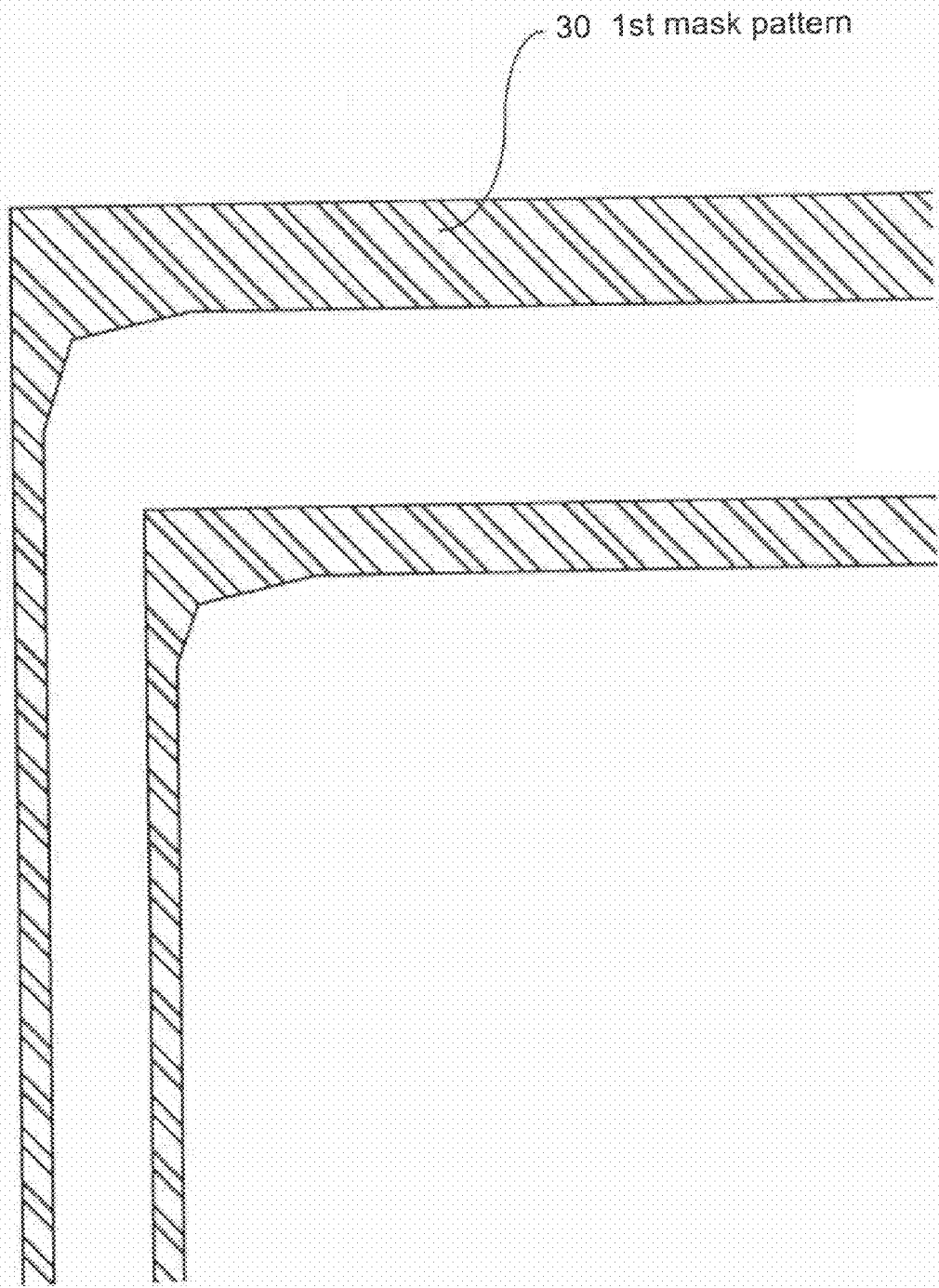
FIG. 4 is a patterned view of a first mask which has narrowed the resist pattern shown in FIG. 3.
Figure 5:
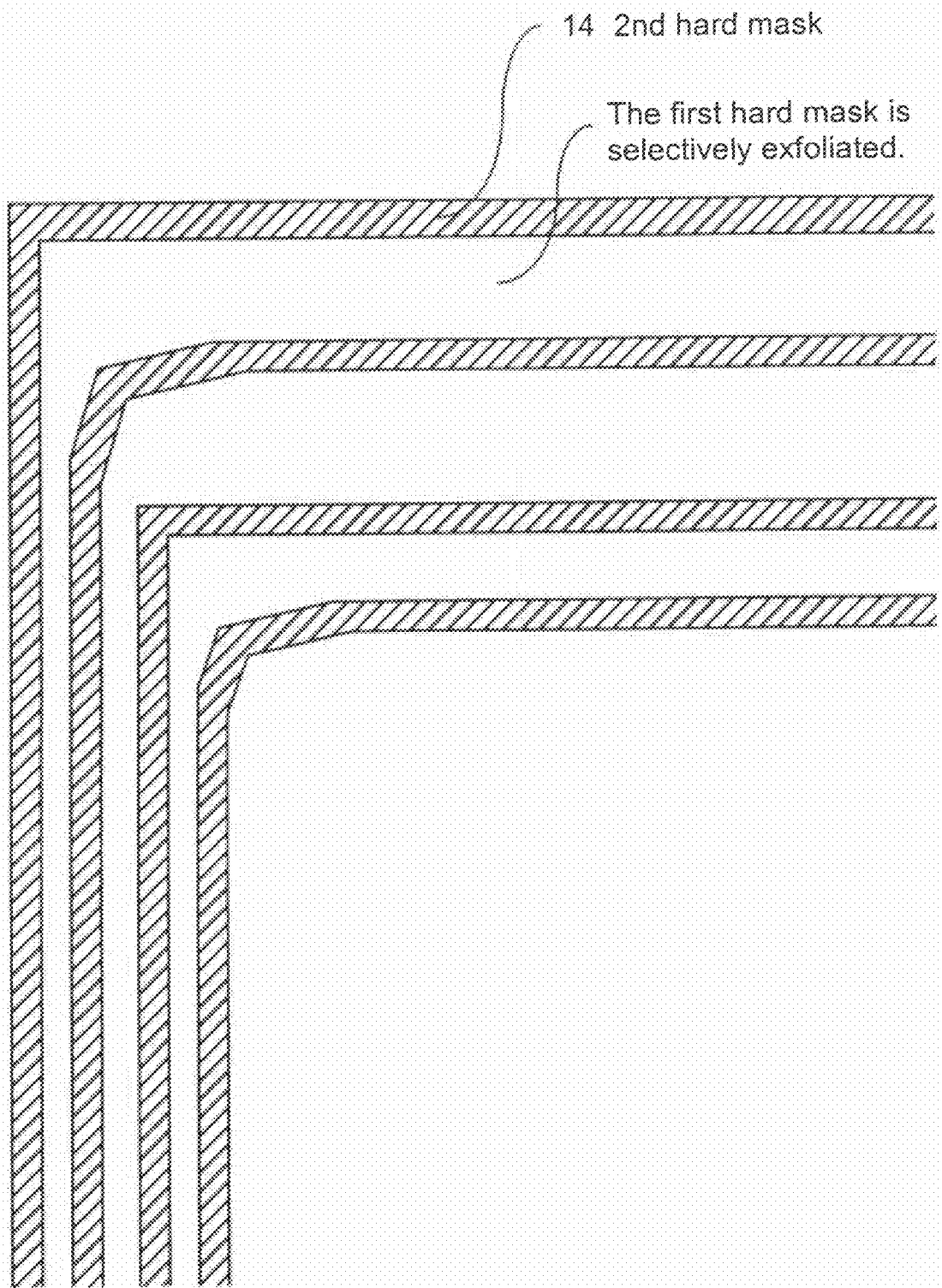
FIG. 5 is a patterned view of a third mask pattern which forms a line.

The formation of the parts of the cell gates four corners will be roughly explained. Because the basic manufacture method has already been explained here the explanation will focus on points related to the formation of the corner area. The explanation will be based on FIGS. 3 to 5. FIG. 3 is a pattern view of the resist pattern formed by the manufacturing process, FIG. 4 is a pattern view of the first mask pattern which narrowed the resist pattern and FIG. 5 is a pattern view of the third mask pattern which forms a line.

The process up to the depositing of the first hard mask is the same as the process stated above. Next, a resist is deposited using spin coat technology as shown in FIG. 3 and a resist pattern 17 is formed. As shown in FIG. 3, in the part of the corner of the resist pattern 17, the line width of the resist pattern 17 is formed so that it gradually becomes thicker from a predetermined position heading towards the corner on the inner edge of the line. Therefore, the corner at the inner edge of resist pattern 17 is formed of a corner part constructed from two areas which are placed in a perpendicular direction and another two areas which are connected to each of the two areas at a 90 degree angle or more and an angle of less than 180 degrees heading towards the corner. Using the resist pattern 17 for a mask, the first hard mask is processed, and then it is slimmed to about half the size and formed into first mask pattern 30 as shown in FIG. 4. The second hard mask is deposited on the first hard mask which has been slimmed by CVD technology, the first hard mask and the second hard mask are anisotropically etched and the first hard mask and the side wall part of second hard mask is left. Further, the first hard mask is selectively etched by CDE etc and removed and the first hard mask and a third mask pattern is formed. This situation is shown in FIG. 5. Further, using the third mask pattern for a mask a third hard mask is anisotropically etched and a final mask pattern is formed. Using the final mask pattern for a mask, the gate material is etched and the cell gate is formed. Because it is formed by the above method it is possible to form the cell gate corner part without the end narrowing or breaking.

Figure 35:
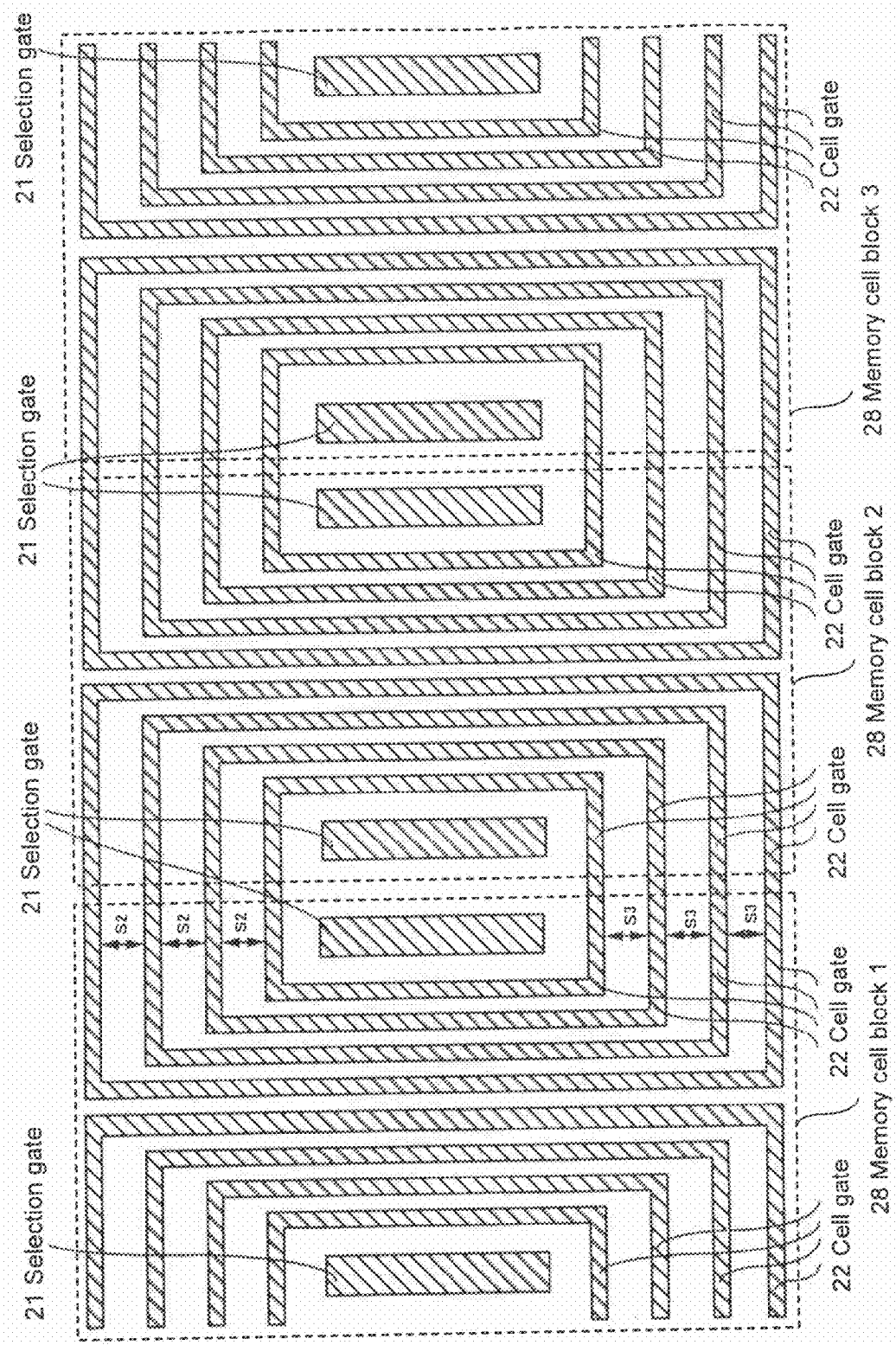
FIG. 35 is a horizontal view of a second cell gate placement within the memory cell block of the semiconductor device related to embodiment one of this invention.

Further, the semiconductor device related to embodiment one of this invention has a cell gate which has a roughly rectangular closed loop and two adjacent memory blocks which share the cell gate, however, the cell placement is not limited to the placement shown in FIG. 1. FIG. 35 shows another example of the placement of the cell gate which has a roughly rectangular closed loop related to embodiment one of this invention. In FIG. 35, the cell gate 22 in memory cell blocks 1, 2 and 3 are shared by memory cell blocks 1 and 2 (each 28) and memory cell blocks 2 and 3 (each 28). That is, two memory cell blocks 28 apart from the memory cell block of both ends of the adjacent memory cell blocks 28, share two or more cell gates 22. The memory cell block 2 (28) in FIG. 35 shares the cell gate with the memory cell block 1 (28), and shares another cell gate with the memory cell block 3 (28).

This placement method is as follows. The cell gate 22 which has a roughly rectangular closed loop is placed between the corresponding selection gates 21. The roughly center part between the corresponding selection gates 21 is made into a boundary. The cell gate 22 is placed on the left side of the boundary so that the cell gate shares two memory cell blocks 28. The cell gate 22 is placed on the right side of the boundary so that the cell gate shares two memory cell blocks 28. The memory cell block 28 of the both ends of two or more continuous memory cell blocks 28, the part of the cell gate 22 which is placed further out than the outer selection gate 21 becomes in effect a dummy pattern.

Further, the adjacent cell gate gap of the two area parts of cell gate 22 which has a roughly rectangular closed loop and which runs perpendicular to the corresponding selection gate 21, is set wider than another two areas and the adjacent cell gate gaps S2 and S3 are all substantially set at the same gap. As shown in FIG. 1, the adjacent cell gate gap S2 is set widely in the upper area part of the two areas which run perpendicular to the corresponding selection gate 21. Also, the adjacent cell gate gap S3 can be set widely in the lower area part of the two areas which run perpendicular to the corresponding selection gate. Therefore, according to adjustment of circuit design, desired circuit design can be easily obtained. Also, in the area where the adjacent cell gate gap is set widely, while securing a sufficient contact adjustment margin it is possible to arrange a contact and respond to miniaturization.

Further, in the semiconductor device related to embodiment one of this invention, the example which was applied to the NAND cell unit of the NAND type flash memory was explained, however, it is not limited to this. It is also possible to replace the memory cell of the NAND cell unit with a normal transistor. However, in this case, it should be constructed of a circuit which has a specific function so that the cell gate becomes the gate line of a transistor and that each transistor is connected and isolated. In this case, the cell gate explained in the present embodiment means a gate and the memory cell block means, for example, a plurality of gates lines which make a transistor block which is formed by a fixed line and space pattern.

Further, the manufacturing method stated above is not limited to the manufacture of the gate, for example, it is also effective in the manufacture of the activity region AA and the wire layer and it is exactly the same in all the embodiments below.

Embodiment 2

In the semiconductor device related to embodiment one of this invention, two memory cell blocks share a cell gate which has a roughly rectangular closed loop, however, if this manufacturing method is applied, it is possible to provide a semiconductor device where each memory cell block has its own cell gate. In the semiconductor device related to the second embodiment of this invention, each memory block has a plurality of cell gates which have a roughly U shaped open loop and the opening of the plurality of cell gates which are placed within each of two adjacent memory cell blocks are each placed facing each other. Here, the roughly U shaped open loop refers to a horseshoe form where one area part is open. In the roughly U shaped open loop, the concave which is composed from two parallel parts and one part roughly perpendicular to these two parts and the corner area of the concave which is constructed from a plurality of areas which connect the two areas and two perpendicular areas has an angle which crosses the plurality of areas of 90 degrees or more and less than 180 degrees. Also, the angle is constructed from a curve. Hereinafter, the areas which constitute the roughly U shaped loop may be called "line", respectively.

Figure 16:
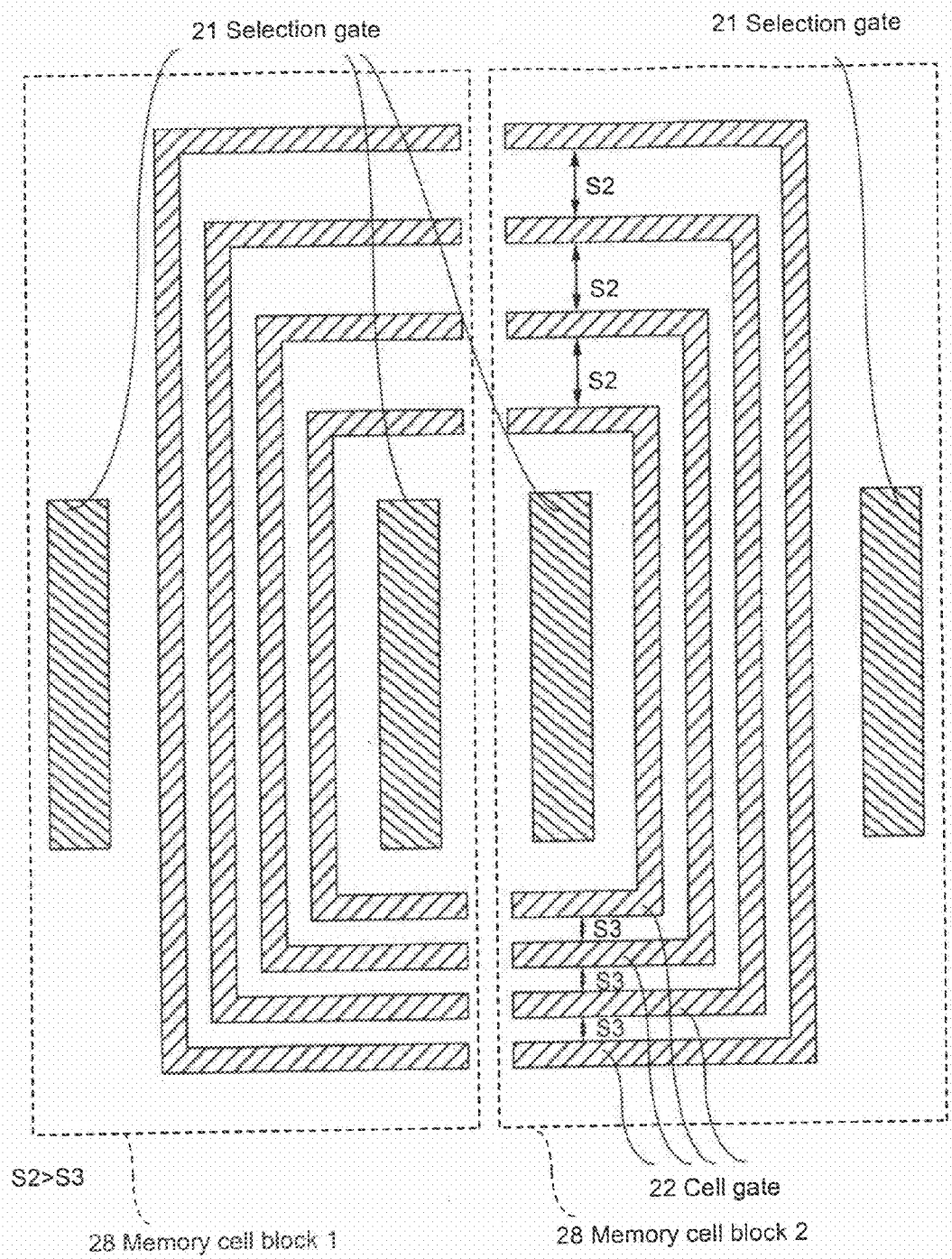
FIG. 16 is a horizontal view of the first cell gate placement within the memory cell block of the semiconductor device related to a second embodiment of this invention.
Figure 37:
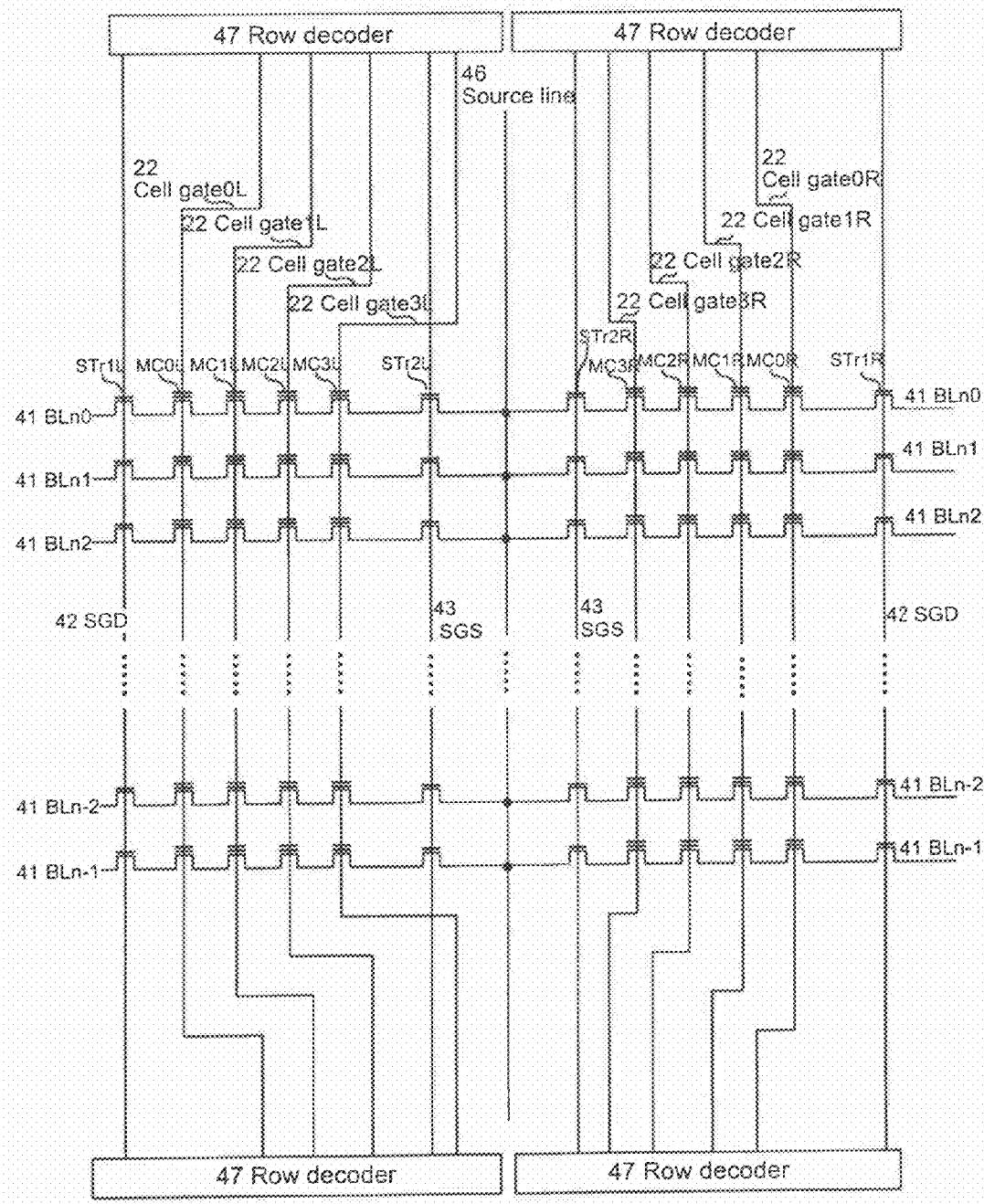
FIG. 37 is an equivalent circuit diagram of the semiconductor device related to a second embodiment of this invention.

The semiconductor device related to the second embodiment of this invention will be explained based on the drawings. FIG. 16 is a horizontal view of the placement of the cell gate within memory block 28 of the semiconductor device related to the second embodiment of this invention. Also, FIG. 37 is an equivalent circuit diagram of the semiconductor device shown in FIG. 16. The memory block shown in FIG. 16 shows a memory block 28 of a NAND type flash memory similar to FIG. 1, however, it is not limited to this and the memory cell of the NAND cell unit can be replaced with a usual transistor. However, in this case, it should be constructed of a circuit which has a specific function so that the cell gate becomes the gate line of the transistor and each transistor is connected and isolated. As shown in FIG. 16, two corresponding selection gates 21 are placed in the memory block 28. In the selection gate 21 a plurality of cell gates are placed.

The plurality of cell gates 22 have a roughly U shaped open loop and are placed so that the openings of the open loop are all facing the same direction within one memory cell block 28. Also, in the adjacent two memory cell blocks 28 the openings of the plurality of cell gates 22 which are placed in each of the memory cell blocks 28 are placed symmetrically facing each other. In other words, in this embodiment, the plurality of cell gates have a first group of the cell gates and a second group of the cell gates. All openings of the roughly U shaped open loops of the first group of the cell gates face a first direction and all openings of the roughly U shaped open loops of the second group of the cell gates face a second direction being opposite to the first direction. FIG. 16 shows four cell gates 22 in a row, however it is not limited to this. As similarly stated in embodiment 1 above, there is no limit to the number of cell gates.

When this is shown by an equivalent circuit diagram, in FIG. 37, a plurality of memory cells (MC0L-MC3L and MC0R-MC3R) are connected in series and one end is connected to bit line BL41 through selection gate transistor STr1 (STr1L and STr1R) which is connected to selection gate line SGD42. The other end of the plurality of memory cells is connected to a common source line 46 through selection gate transistor STr2 (STr2L and STr2R) which is connected to selection gate line SGS43. The control gate of each memory cell is connected to cell gate 22 (cell gate 1-cell gate 4). A plurality of memory cells which are connected to one cell gate 22 are constructed of a unit called a [page]. Cell gates 22 are each connected to row decoder 47 through a transfer gate by the wiring extracted respectively from the cell gates. By controlling the selection gate 21 in FIG. 16 the memory block 28 which performs data program and read is selected.

The plurality of cell gates 22 are placed in the two adjacent memory cell blocks 28 so that their openings are facing each other. That is, the plurality of cell gates 22 are placed so that they may become symmetrical with an outline focusing on a boundary line of the two adjacent memory cell blocks 28. Also, the adjacent cell gate gap of the cell gates 22 in the upper part area among the two areas which run perpendicular to the corresponding cell gate 21 in one memory cell block 28 is set widely.

From the above stated placement, in the semiconductor device related to the second embodiment of this invention one memory cell block 28 has it own plurality of cell gates 22 and unlike the semiconductor device related to embodiment one of this invention, erasure is possible in one block units. Also, it is possible to easily secure a sufficient contact adjustment margin and to arrange a contact.

In FIG. 16, the adjacent cell gate gap of the plurality of cell gates 22 in the upper part area among the two areas which run perpendicular to the corresponding cell gate 21 in one memory cell block 28 is set widely, however, in the area where the adjacent cell gate gap becomes wide in the semiconductor device related to the second embodiment of this invention, the lower part area among the two areas which run perpendicular to the corresponding cell gate 21 can also be set widely.

Figure 17:
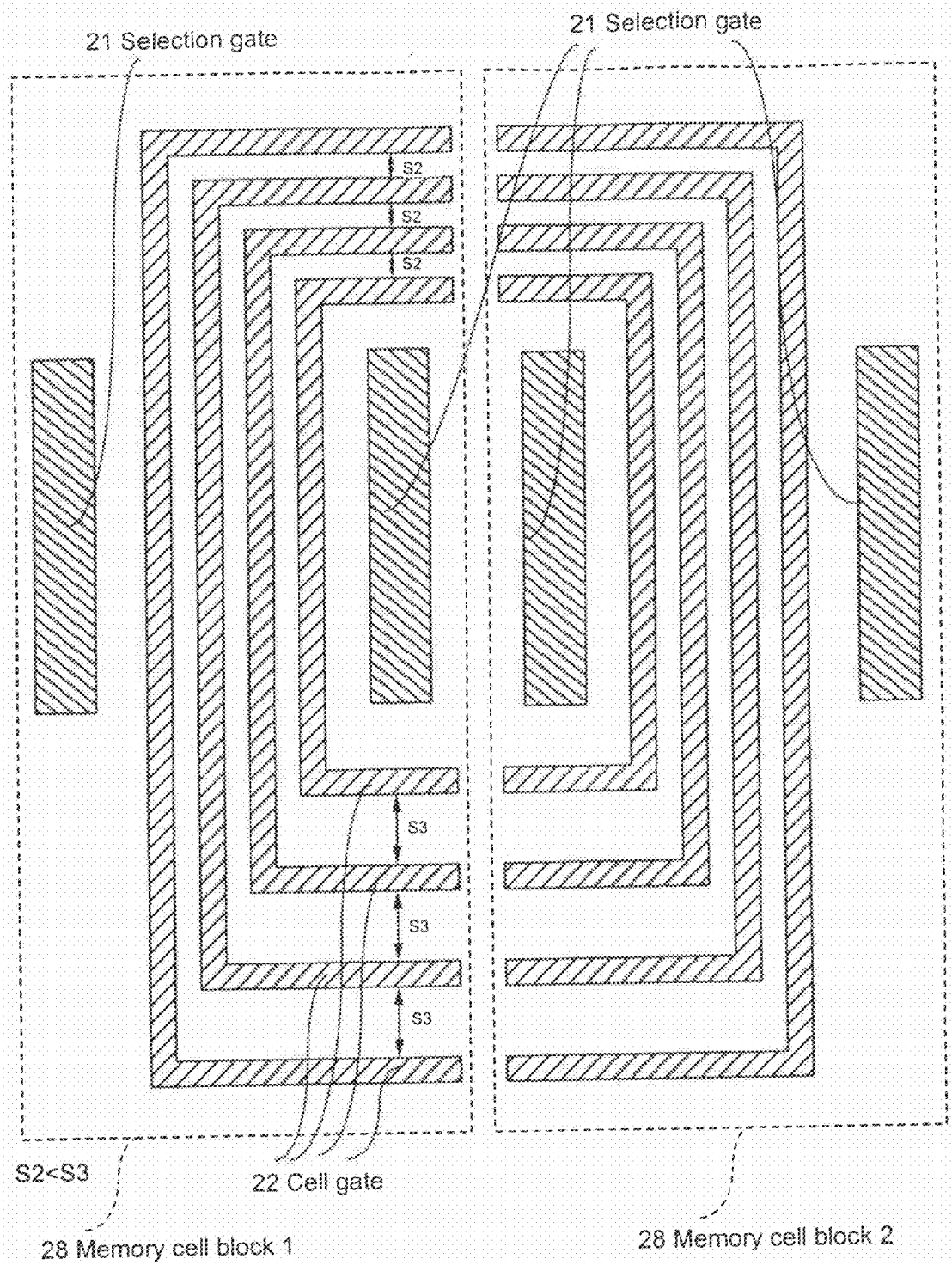
FIG. 17 is a horizontal view of the second cell gate placement within the memory cell block of the semiconductor device related to a second embodiment of this invention.

FIG. 17 is a horizontal view of the second placement of a cell gate within the memory cell block of the semiconductor device of the second embodiment of this invention. Unlike FIG. 16, in FIG. 17, in the area where the adjacent cell gate gap becomes wide, the lower part area among the two areas which run perpendicular to the corresponding cell gate 21 is set widely. In the whole memory design which includes memory cells there is a case where the lower area side must be set widely. It is possible to respond to such a case in this invention.

Also, in the semiconductor device related to the second embodiment of this invention, the adjacent cell gate gap in the two areas which are perpendicular to the corresponding selection gate 21 can be set widely. As miniaturization progresses, although it is difficult to easily secure a sufficient contact adjustment margin and to arrange a contact in only one area, it is possible to arrange the contact over two areas, i.e. arranging a contact in the upper area of each selection gate and arranging a contact in the lower area in the semiconductor device related to the second embodiment of this invention. Also, as miniaturization progresses, when the resistance of the cell gate becomes a problem, it is possible to arrange a contact to the upper and lower areas of one cell gate and improve operation speed.

Figure 18:
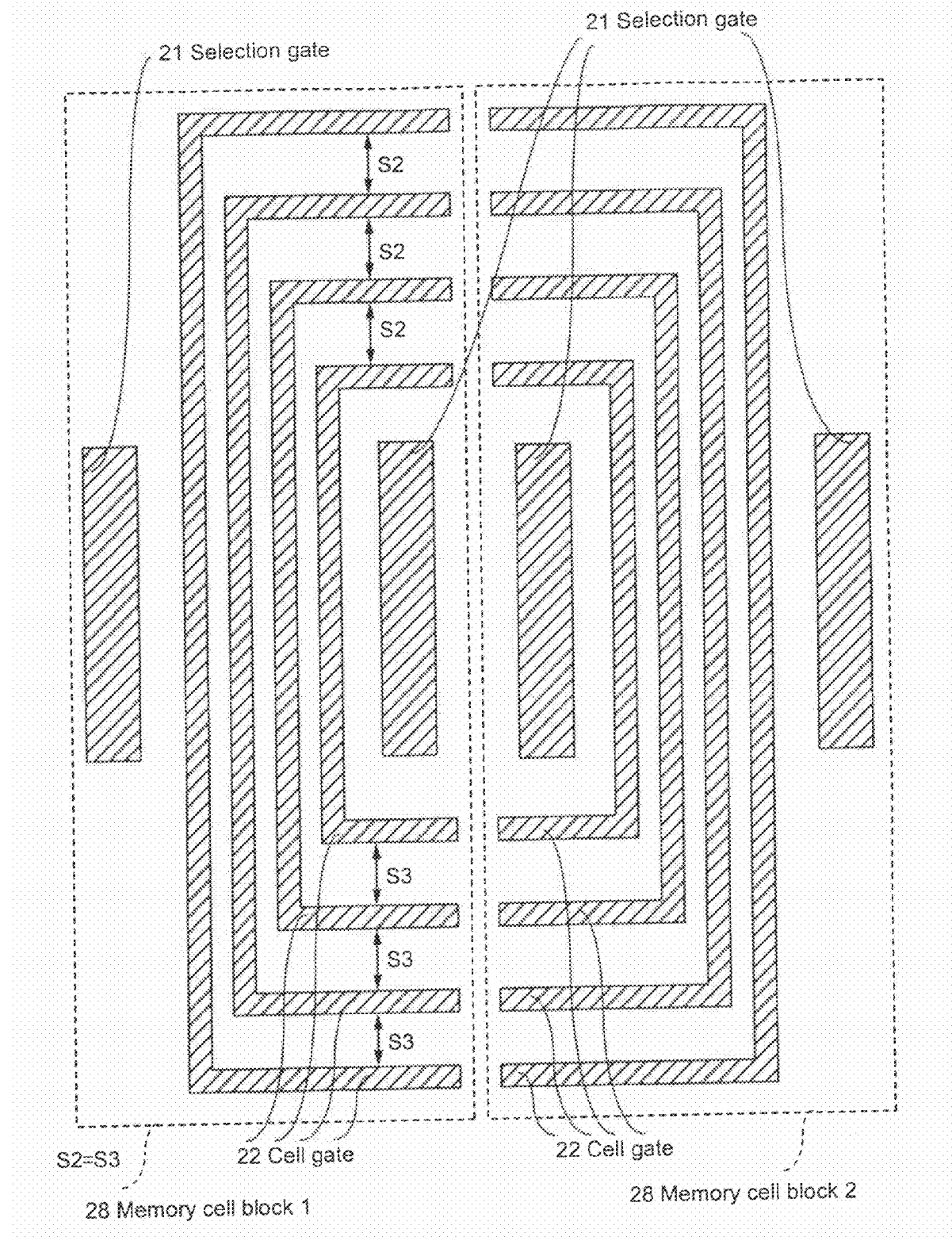
FIG. 18 is a horizontal view of the third cell gate placement within the memory cell block of the semiconductor device related to a second embodiment of this invention.

FIG. 18 is a horizontal view of the third placement of a cell gate within the memory block of the semiconductor device related to the second embodiment of this invention. The plurality of cell gates 22, which have a roughly U shaped open loop, are placed so that the openings of the open loop are all facing the same direction between two (one pair of) selection gates 21 within each memory cell block 28. Then, between the adjacent memory cell block 1 (28) and the memory cell block 2 (28) the plurality of cell gates 22 are placed so that the openings face each other. In the two areas which are perpendicular to the corresponding selection gate 21 the gap of the adjacent cell gate in the cell gate 22 is set wider compared to the area which is parallel to the corresponding selection gate 21. Then, the adjacent cell gate gaps S2 and S3 in the two areas are actually set at the same gap. Therefore, it is possible to easily secure a contact adjustment margin and to arrange a contact in either of the two areas.

Figure 22:
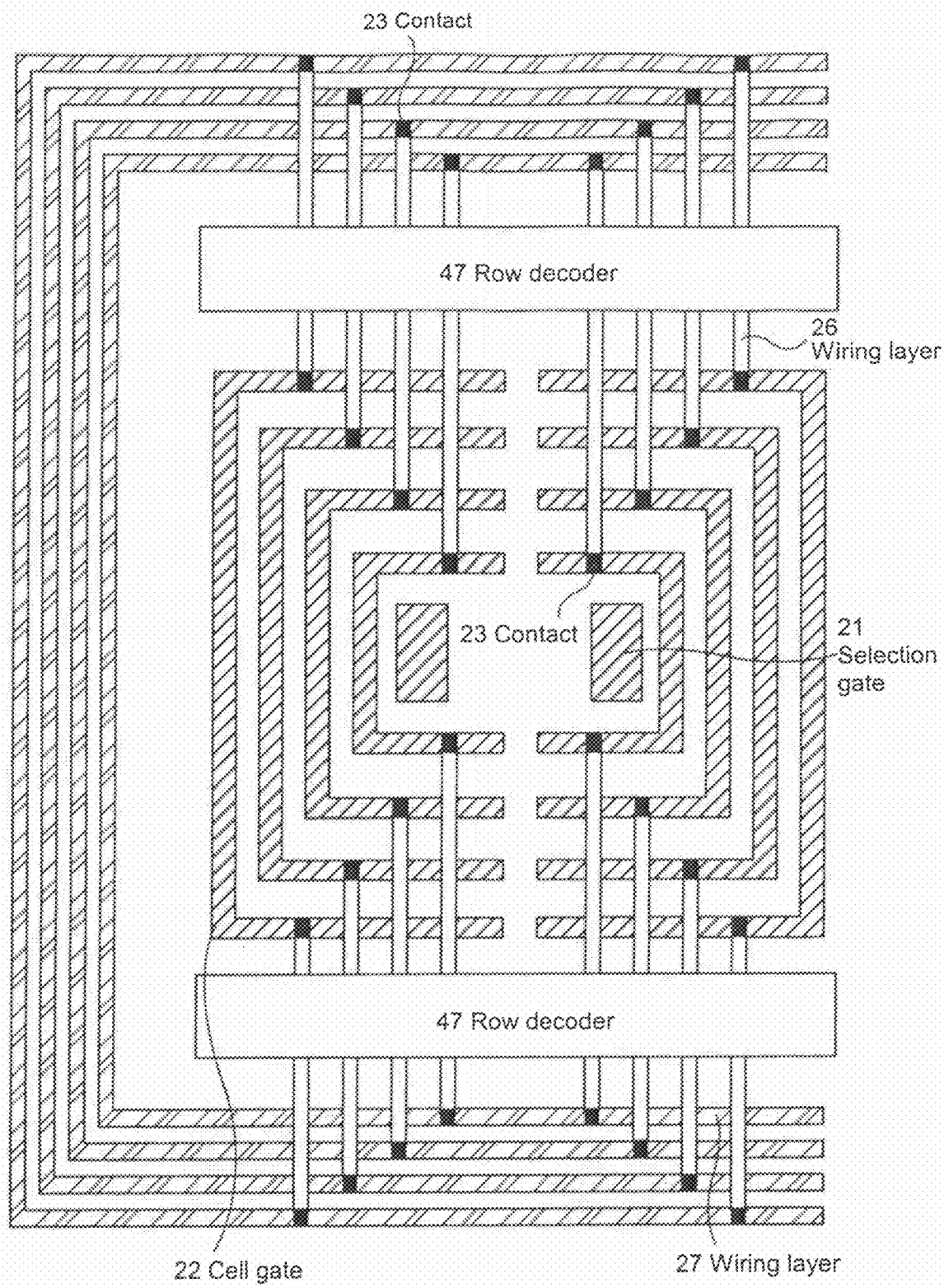
FIG. 22 is a horizontal view which shows an example contact arrangement within the memory cell block of the semiconductor device related to embodiment one of this invention.
Figure 23:
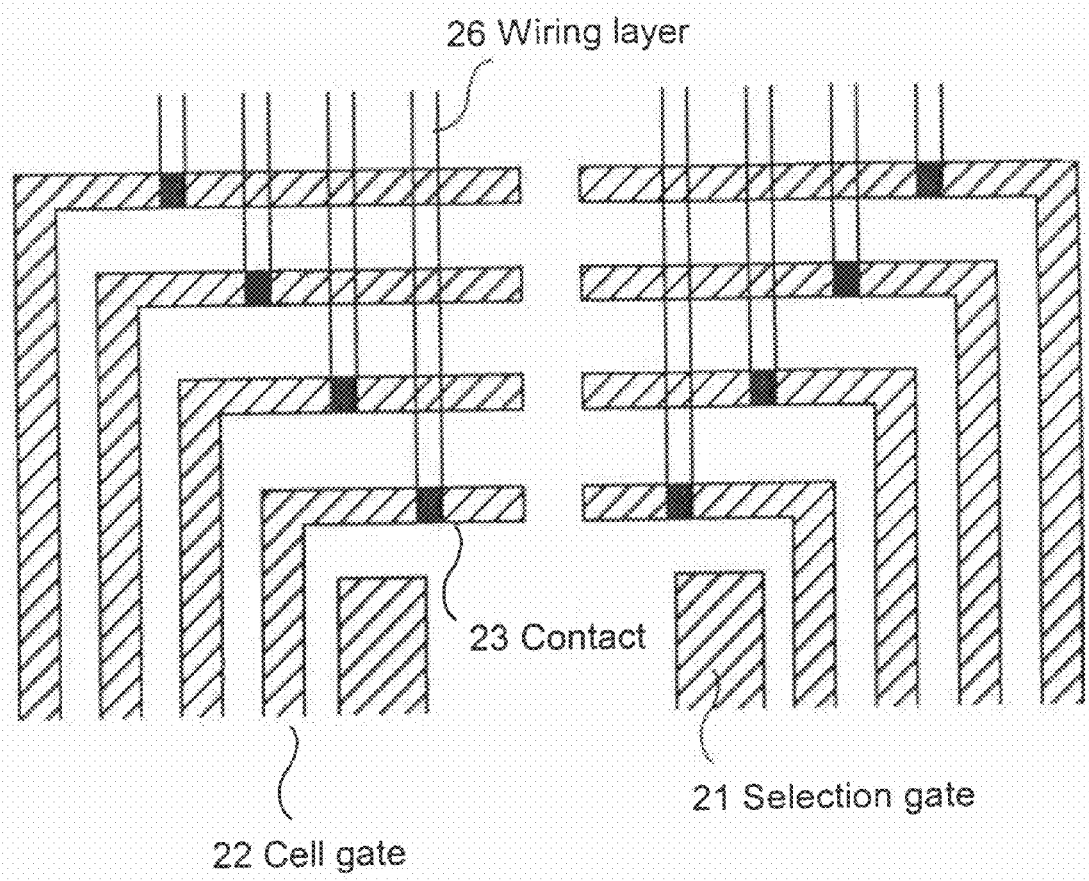
FIG. 23 is an enlarged view of the contact shown in FIG. 22.

As shown in FIGS. 16 to 18, in the semiconductor device related to the second embodiment of this invention, it is possible to set either of the two areas which are perpendicular to the corresponding selection gate as the area where the adjacent cell gate gap becomes wide and it is also possible to set both areas widely. An example arrangement of the contact in the above placement is shown in FIGS. 22 to 24. FIG. 22 is a horizontal view which shows an example arrangement of the contact in the cell gate placement shown in FIG. 18. FIG. 23 is an enlarged horizontal view which shows an example arrangement of the contact shown in FIG. 22. FIG. 24 is a horizontal view which shows the second example arrangement of the second contact in the cell gate setting shown in FIG. 18. Further, in FIGS. 22 to 24, in order to easily explain the contact, part of the selection gate has been omitted.

As shown in FIG. 22, in the semiconductor device related to the second embodiment of this invention, in the two areas which are perpendicular to the corresponding selection gate 21, the gap of the adjacent cell gate is set wider compared to the area which is parallel to the corresponding selection gate 21. In the memory cell block which has this cell gate 22, when arranging a contact with the upper layer wiring and the lower layer wiring, they are set as shown in FIG. 22. In this type of setting, as shown in FIG. 23, because the adjacent cell gate gap of the area of cell gate 22 where the contact 23 is arranged widely, it is possible to easily secure a sufficient contact adjustment margin and to arrange the contact 23 on the cell gate 22.

As shown in FIG. 23, the wire becomes narrow due to miniaturization, and in line with this, in the case where the line width of cell gate 22 becomes narrow, it is necessary to arrange the contact 23 of cell gate 22 and each wire in a narrow position. Generally, because connecting the contact 23 which electrically connects wire 26 and cell gate 22, in a narrow position with high precision requires an extremely high level of technology, usually it is arranged with a fixed contact adjustment margin. However, for example, in FIG. 23 when arranging a contact in the area of the cell gate 22 which is parallel with the corresponding selection gate, because the adjacent cell gate gap in this area is narrow it is necessary to arrange the contact 23 with a pinpoint. As the number of cell gates 22 increases with larger capacity, or as requests for reductions in size continue there is a probability that a sufficient contact adjustment margin cannot be secured. Because the contact 23 can be arranged in the area where the adjacent cell gate gap is set widely in the semiconductor device related to the second embodiment of this invention, a sufficient contact adjustment margin can be secured and a small misalignment of contact 23 can be absorbed.

Also, in the semiconductor device of the second embodiment of this invention, it is possible to respond even if miniaturization progresses further. FIG. 24 is a horizontal view which shows a second example arrangement of a contact of a cell gate placement shown in FIG. 18. In FIG. 24 the wire 26 is connected with the cell gate one by one via the contact 23, however, the position of the contact 23 is arranged alternately on each cell gate 22 in the upper part and lower part of the 2 areas which are perpendicular to the corresponding selection gate. In other words, odd and even contacts 23 are arranged on first and second lines facing the first line of the cell gates 22 including odd cell gates and even cell gates. Each of the even cell gates is inserted between respective odd cell gates of the odd cell gates. Each of the odd contacts is connected to a corresponding odd cell gate of the odd cell gates at the first line and each of the even contacts is connected to a corresponding even cell gate of the even cell gates at the second line. Furthermore in other words, the position of the contact 23 is arranged on the cell gate closest to the selection gate and subsequent cell gates which are not adjacent in the area of the plurality of cell gates whose adjacent cell gate gap is set wide. The adjacent cell gate gap is set widely in the two areas, however, in the case of arranging contact 23 in only one area of the two areas, when the improvement in connection accuracy of the contact 23 does not catch up with the progress of miniaturization it is possible to foresee that arranging the contact 23 will become difficult because of the narrowing of the wire gap 26. However, if the contact 23 is distributed and arranged in both the upper and lower areas, even if the gap of wire 26 becomes narrow it is possible to be absorbed by making the adjacent cell gate gap wide. Therefore, it is possible to arrange a contact with a sufficient contact adjustment margin in the semiconductor device related to the second embodiment of this invention.

The drawing in FIG. 16 has been omitted, however, in the semiconductor device related to the second embodiment of the present invention, the plurality of cell gates 22 have a plurality of areas and a corner which is formed from more than two areas of the plurality of areas. Then, the gap, which is formed by the nth cell gate and (n+1)th (n is an odd number) cell gate from the outer side towards the inner side, is set so that the inner side gradually becomes wider from a predetermined position towards the corner. In other words, the gap which is formed by the vertical gap between the nth cell gate and (n+1)th (n is an odd number) cell gate gradually becomes wider towards the outer corner of the nth cell gate and the gap which is formed by the horizontal gap between the nth cell gate and the (n+1)th cell gate gradually becomes wider towards the outer corner of the nth cell gate. This is the same as in embodiment 1 of this invention. By adopting this setting and using sidewall mask transfer technology it is possible to manufacture a cell gate without narrowing or breaks occurring in the gate corner part.

Figure 25:
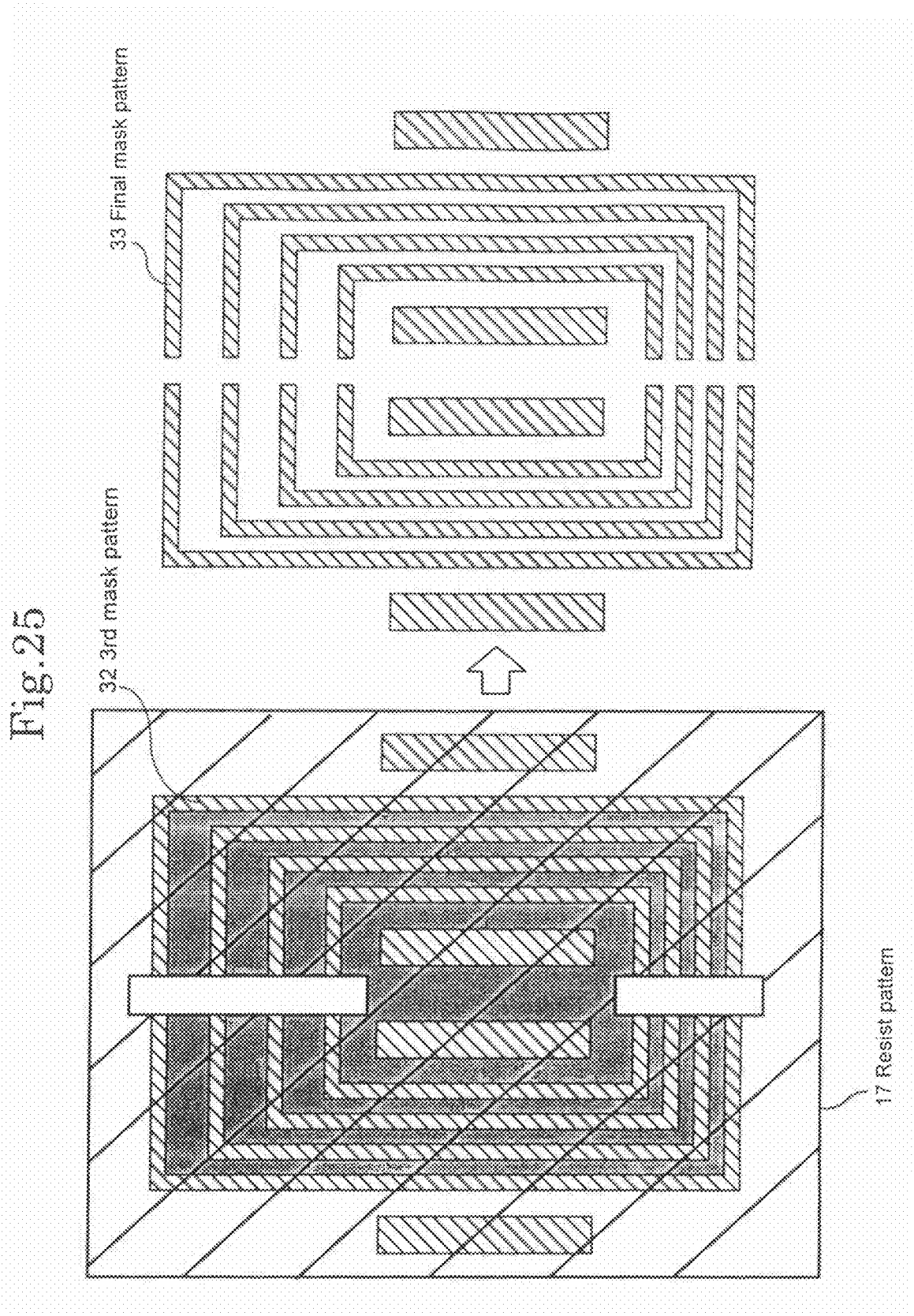
FIG. 25 is a patterned view which shows the creation process of a final mask pattern of the semiconductor device related to a second embodiment of this invention.

As stated above, in the semiconductor device related to the second embodiment of this invention, a roughly U shaped open loop cell gate is placed so that the opened loop openings are facing each other in the adjacent two memory cell blocks. A cell gate and selection gate which are placed in this way are manufactured by successive processes. Below, FIG. 25 is explained. FIG. 25 is a pattern view which shows the creation process of the last mask pattern of the semiconductor device related to the second embodiment of this invention.

In particular, the final mask pattern is formed by a process common with the manufacturing process which forms the plurality of cell gates of roughly rectangular closed loop which are shared by two adjacent memory cell blocks explained in embodiment 1 of this invention. That is, the above stated manufacturing process is the same up until the process which forms the roughly rectangular closed loop third mask pattern. Therefore, the explanation of the process up to this point will be omitted.

After forming the third mask pattern 32, as shown in FIG. 25, a resist pattern 17 covers the whole surface and the opening of the part which is equivalent to the center part of the two areas which is perpendicular to the corresponding selection gate of the four areas of the third mask pattern 32 which has a roughly rectangular closed loop is formed. As for the opening, all the lines of the area which is perpendicular to the corresponding selection gate of the third mask pattern of a roughly rectangular closed loop are formed so that the roughly center part of the line is completely exposed. Using the resist pattern 17 as a mask, the third mask pattern 32 is etched. Furthermore, after removing the resist pattern 17, using the third mask pattern 32 as a mask, the third hard mask is etched. The final mask pattern 33 is formed as shown on the right of FIG. 25.

The final mask pattern 33 is formed, as shown in FIG. 25, by a mask pattern of a roughly rectangular closed loop which is formed by abridging the two adjacent memory cell blocks separated into two by the center part of the area which is perpendicular to the corresponding selection gate and a roughly U shaped open loop mask pattern is placed in a roughly symmetrical position within the two adjacent memory cell blocks. Using the roughly U shaped open loop mask pattern as a mask, the cell gate shape is formed by dry etching the gate material 12. By the above process the semiconductor device related to the second embodiment of this invention is formed.

Because the cell gate of the semiconductor device related to the second embodiment of this invention is formed by the above stated process, each memory block has its own cell gates and unlike embodiment one of this invention, erasure of the memory cells in one block units becomes possible.

Also, the cell gate in the semiconductor device related to the second embodiment of this invention is formed at first in a roughly rectangular closed loop and because it is finally formed into a roughly U shaped open loop by etching there is no narrowing or breaking of the resist pattern. Also, as in embodiment one of this invention, an odd numbered gap from the outer side towards the inner side is set so that the line gap of the plurality of cell gates 22 gradually becomes wider heading towards the two corners of the cell gate 22 which has a roughly U shaped open loop. As a result, occurrences of narrowing or breakage in the resist pattern can be further suppressed and there is no short circuit in the line of cell gate 22 which is finally formed.

Further, because the plurality of cell gates, which are formed in a roughly U shaped open loop in the semiconductor device related to the second embodiment of this invention, are formed by the above stated process, it is possible to widen the adjacent cell gate gap in the area which is perpendicular to the corresponding selection gate. Therefore, a contact can be arranged with a sufficient contact adjustment margin and a small misalignment of the contact can be absorbed.

Embodiment 3

The semiconductor device related to the second embodiment of this invention has a memory block wherein each memory block has its own cell gate of a roughly U shaped open loop. And, the cell gate of a roughly U shaped open loop is formed at first in a roughly rectangular closed loop in adjacent memory cell blocks and is separated by the roughly U shaped open loop through an etching formation process. Also, the adjacent cell gate gap in the areas one and two which are perpendicular to the corresponding selection gate where the cell gate has a roughly U shaped open loop is set widely. However, a case may occur where the adjacent cell gate gap in the areas one and two of the area which is perpendicular to the corresponding selection gate cannot be set that wide due to the total memory space. In the semiconductor device related to the third embodiment of this invention the plurality of cell gates which are placed within the memory block have a roughly U shaped open loop and the plurality of cell gates within one of the memory blocks is placed so that the open loop openings mutually face away from each other. And, each of the openings of the plurality of cell gates which are placed in each of two adjacent memory blocks are placed symmetrically facing each other. That is, within one memory block the plurality of cell gates are placed in a back to back form between a pair of selection gates.

Figure 19:
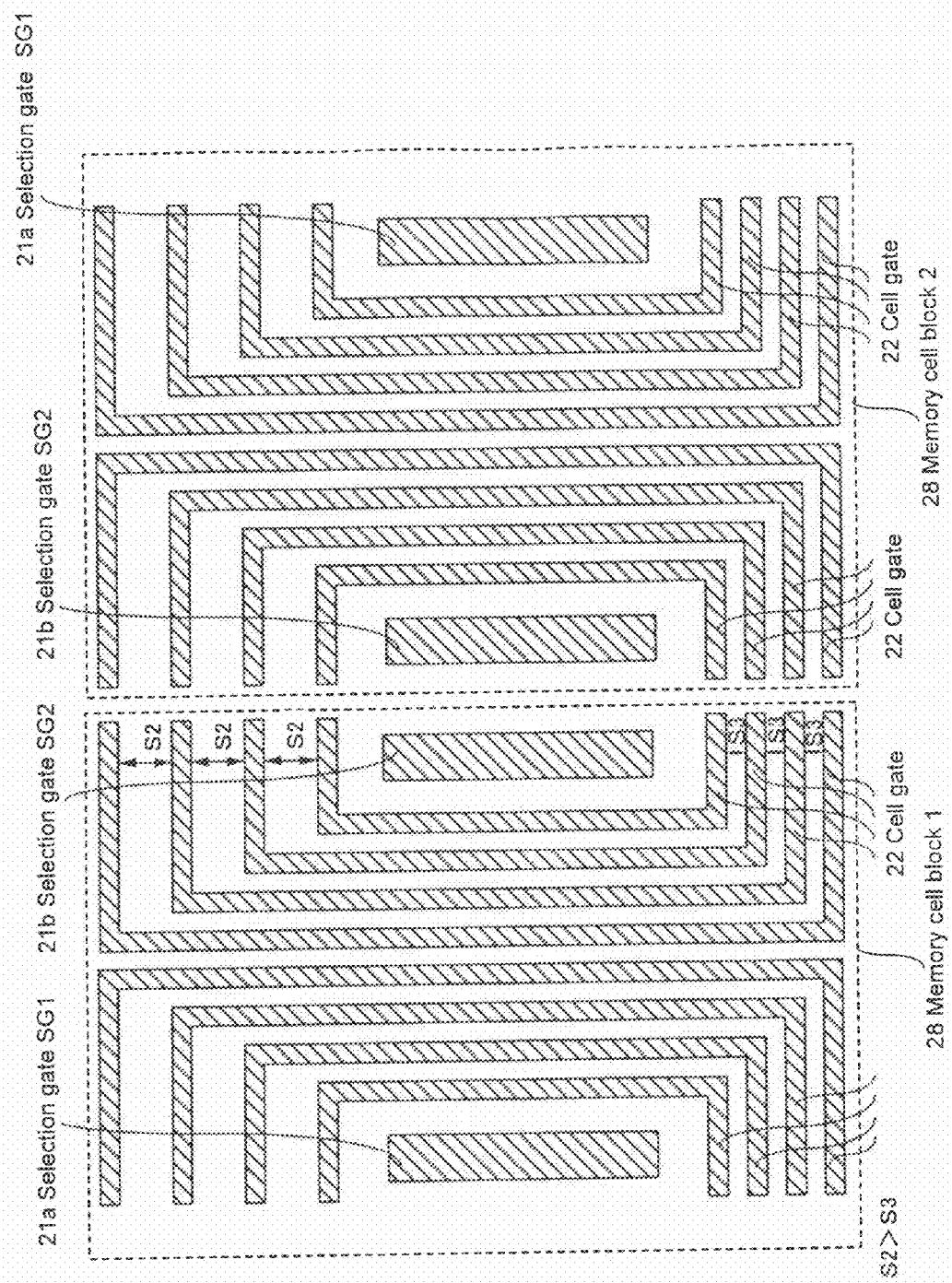
FIG. 19 is a horizontal view of the first cell gate placement within the memory cell block of the semiconductor device related to a third embodiment of this invention.

FIG. 19 is a horizontal view of the placement of cell gate 22 within the memory block 28 of the semiconductor device related to the third embodiment of this invention. The two adjacent memory blocks 1 and 2 (28) are shown, however, in the plurality of cell gates 22 within each memory cell block 1 and 2 (28) half of these cell gates are placed so that the opposite side part to the opening (back part) mutually faces the remaining half. That is, a plurality of the openings are placed in a back to back form so that the openings face in opposite directions. In FIG. 19 the plurality of cell gates 22 within the memory cell block 1 (28) are placed between two selection gates SG1 (21a) and SG2 (21b). And, the plurality of cell gates 22 in FIG. 19, are placed so that four cell gates are placed back to back with another four cell gates so that the roughly U shaped open loop opening of four of the cell gates 22 is placed facing the direction of selection gate SG1 (21a) and the roughly U shaped open loop opening of another four of the cell gates 22 is placed facing selection gate SG2 (21b). This is the same in the memory cell block 2 (28)

The cell gate 22 which has this placement is separated from the cell gate 22 of the adjacent memory block 28. Therefore, both memory cell blocks 1 and 2 (28) both have their own cell gates 22. As a result, in the semiconductor device related to the third embodiment of this invention it is possible to perform erasure in one block units as in the semiconductor device related to the second embodiment of this invention.

Also, in the semiconductor device related to the third embodiment of this invention, the adjacent cell gate gap in the area, which is perpendicular to the corresponding selection gate of the cell gate placed within the memory cell block, is set widely. The adjacent cell gate gap in the upper part area of the two areas which run perpendicular to the corresponding selection gate in FIG. 19 is set widely. Therefore, by arranging a contact in this area a contact can be arranged while securing a sufficient contact adjustment margin and a small misalignment etc in the contact can be absorbed.

Here, according to the third embodiment of this invention shown in FIG. 19, four cell gates 22 are placed back to back with another four cell gates 22 in a roughly symmetrical position. Therefore, in the upper part area of the two areas which are perpendicular to the corresponding selection gate where the adjacent cell gate is set wide, three adjacent cell gate gaps are formed between each of the four cell gates 22. Alternatively, in the second embodiment of this invention shown in FIG. 16, because the openings of the cell gates 22 with a roughly U shaped open loop are placed so that they face the same direction within one memory cell block 28, the number of adjacent gaps formed between eight cell gates 22 becomes seven in the case where eight cell gates are placed. Therefore, if the number of cell gates 22 which are placed, increases, the number of adjacent cell gate gaps also increases and it becomes difficult to place them in terms of space. In the third embodiment of this invention, because the cell gates 22 are placed in a roughly symmetrical position within one block and the open loop openings are placed back to back facing opposite directions the adjacent cell gate gaps are able to be around half the size of those in the second embodiment of this invention. Therefore, this is advantageous when setting space is limited.

Figure 20:
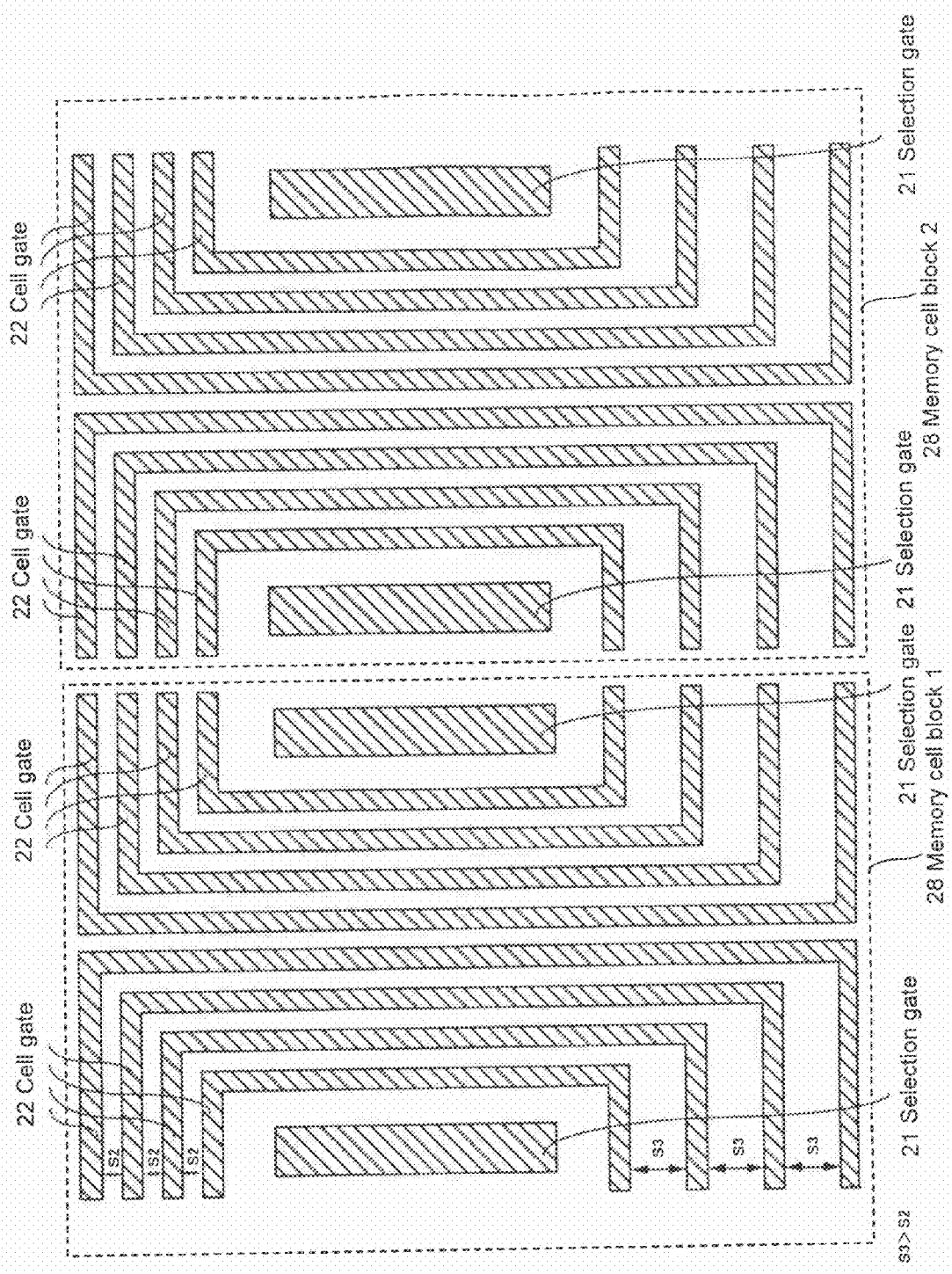
FIG. 20 is a horizontal view of the second cell gate placement within the memory cell block of the semiconductor device related to a third embodiment of this invention.
Figure 21:
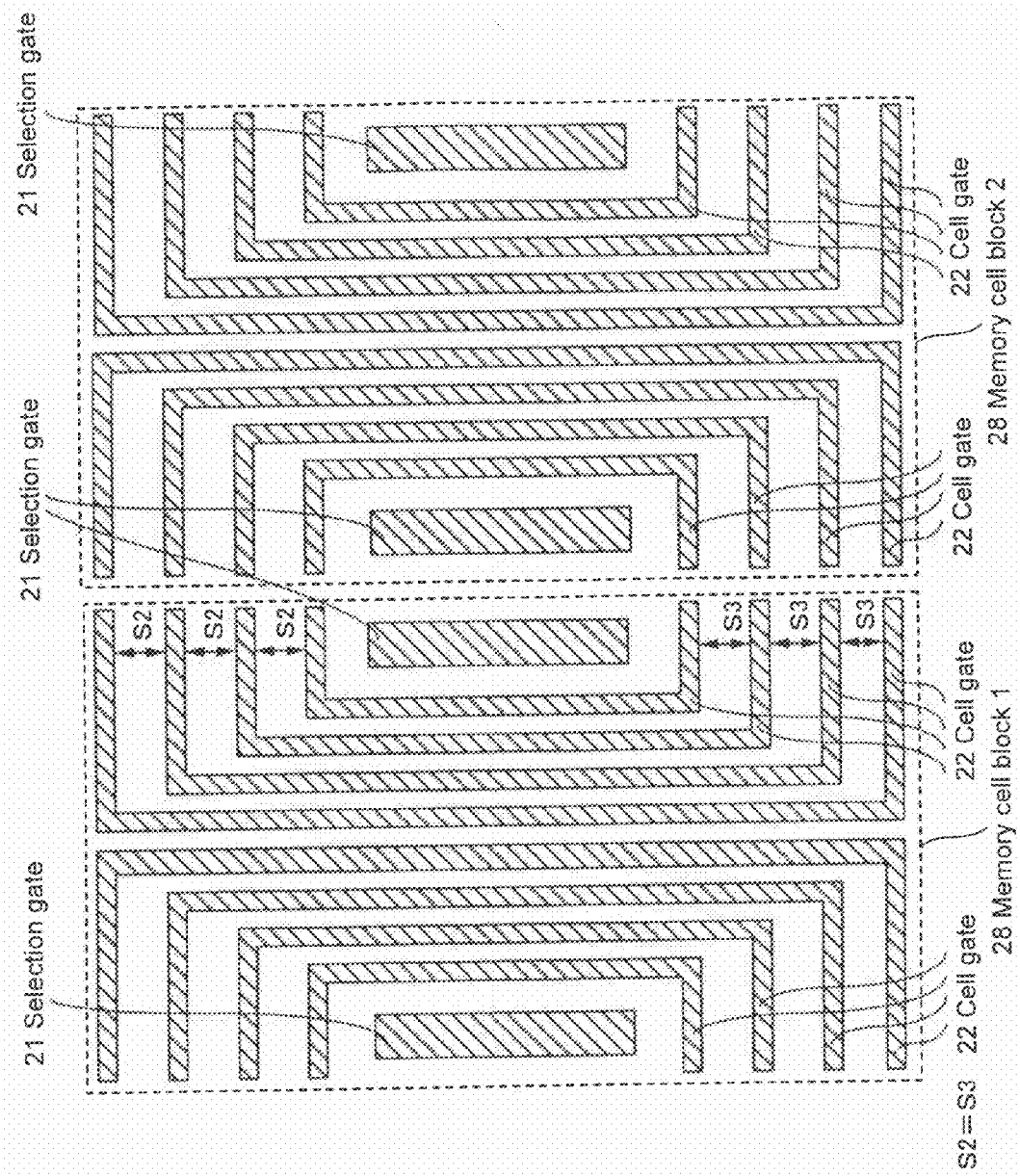
FIG. 21 is a horizontal view of the third cell gate placement within the memory cell block of the semiconductor device related to a third embodiment of this invention.

In the example shown in FIG. 19, the area where the adjacent cell gate is set widely is set as the upper part area of the two areas which are perpendicular to the corresponding selection gate. However, it is not limited to this. FIGS. 20 and 21 are horizontal views of another placement of the cell gate within the memory block of the semiconductor device related to embodiment 3 of this invention. As shown in FIG. 20, the lower area of the two areas which are perpendicular to the corresponding selection gate can be set as the area where the adjacent cell gate gap is set widely. Also, as shown in FIG. 21, the two areas which are perpendicular to the corresponding selection gate can both be set widely. They can be set freely according to space.

Also, in the third embodiment of this invention, the plurality of cell gates which are formed into a roughly U shaped open loop have a plurality of areas and a corner which is formed from more than two areas from the plurality of areas. And, the gap which is formed by the nth cell gate and the (n+1)th (n is an odd number) cell gate from the outer side to the inner side is set so that it gradually becomes wider on the inner side heading towards the corner from a predetermined position. This is the same as in the first embodiment and the second embodiment stated above.

Figure 26:
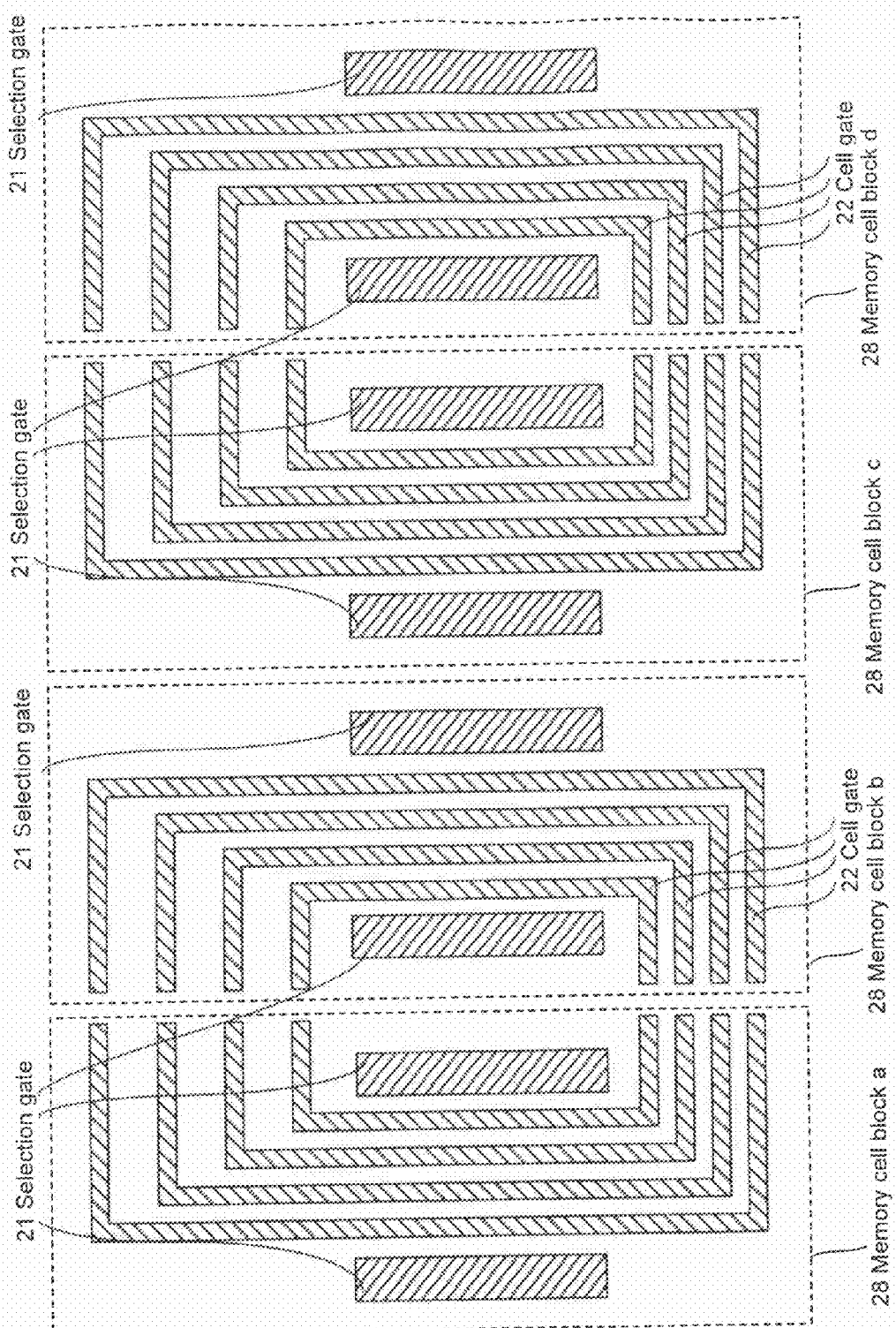
FIG. 26 is a patterned view which represents a formation method of a cell gate of the semiconductor device of a second embodiment of this invention.

The manufacturing method of the cell gate of the semiconductor device related to the third embodiment of this invention is the same as that stated above in the second embodiment of this invention. That is, in the manufacturing method of the cell gate of the semiconductor device related to the second embodiment of this invention stated above, a roughly rectangular closed loop third mask pattern is formed by surrounding two adjacent (opposing) selection gates, a final mask pattern with a roughly U shaped open loop is formed using a resist pattern which has a predetermined opening and using the final mask pattern as a mask, a gate material of poly-silicon etc is etched and formed. The cell is formed by the same manufacturing method but the cell placement is different because the formation position of the roughly rectangular closed loop third mask pattern is different. This is explained in FIGS. 26 and 27. FIG. 26 is a pattern view which represents the formation method of the cell gate in the semiconductor device related to the second embodiment of this invention and FIG. 27 is a pattern view which represents the formation method of the cell gate of the semiconductor device related to the third embodiment of this invention.

The different points between embodiment 2 and embodiment 3 of this invention are as follows. For example, when the cell gate is formed in the adjacent memory blocks a, b, c and d (each 28) in embodiment 2 of this invention, in the memory blocks a and b, and the memory blocks c and d, a roughly rectangular closed loop third mask pattern is formed, the third mask pattern is formed on a resist pattern which has an opening and a final mask pattern is formed and using the final mask pattern as a mask, gate material is etched and cell gate 22 is formed (FIG. 26). Therefore, the formed cell gates 22 are roughly symmetrical in memory cell blocks a and b (each 28) and roughly symmetrical in memory blocks c and d (each 28). However, in the third embodiment of this invention, while taking the four adjacent memory blocks 28 as an example, a roughly rectangular closed loop third mask pattern is formed by abridging memory cell blocks a and b (each 28), cell blocks b and c (each 28) and cell blocks c and d (each 28) and a final cell gate is formed by the above stated process (FIG. 27). Therefore, the formed cell gates 22 in each of the cell blocks a, b, c and d (each 28) are roughly symmetrical between each selection gate. However, in the third embodiment of this invention, taking the memory block b (28) shown in the above stated FIG. 27, the number of cell gates which share a mask pattern of a closed loop between the memory block b and the adjacent memory cell block a (28) and the number of cell gates which share a mask pattern of a closed loop between the memory cell block b and another adjacent cell block c (28) can be a different number. In this case, the plurality of cell gates 22 are formed between the adjacent (opposing) selection gates 21 and are roughly symmetrical and between the two (a pair of) selection gates within the memory block they do not become symmetrical.

Figure 27:
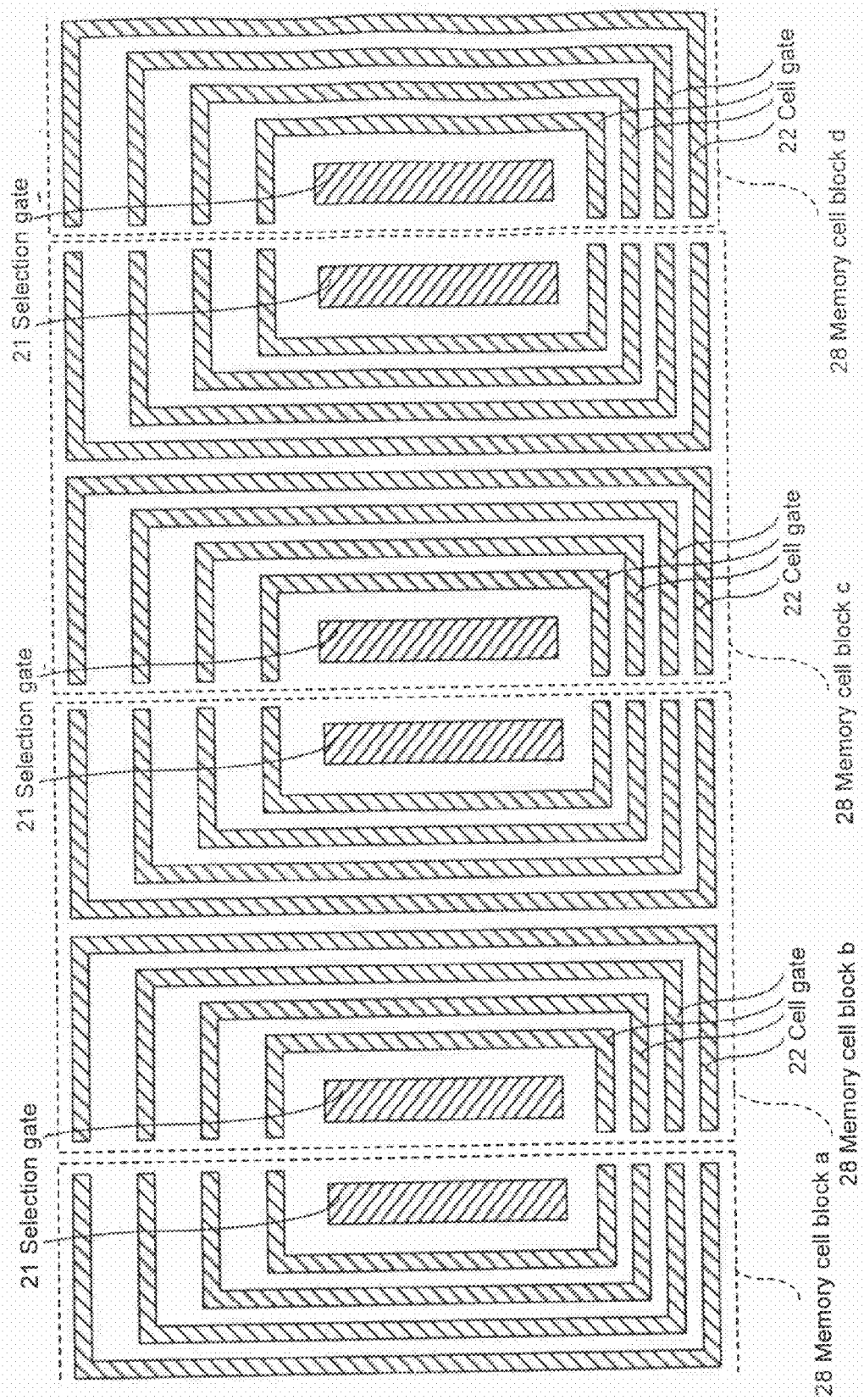
FIG. 27 is a patterned view which represents a formation method of a cell gate of the semiconductor device of a third embodiment of this invention.

In the semiconductor device related to the third embodiment of this invention shown in FIG. 27, a plurality of cell gates 22 which have a roughly U shaped open loop within one memory cell block 28 are placed back to back so that the parts which are on the opposite side to the open loop opening (the back part) are facing each other. Therefore, compared to the case where the plurality of cell gates 22 which have a roughly U shaped open loop within one memory cell block 28 are placed so that the openings are facing the same direction, in the case where the same number of cell gates is placed it is possible to reduce the space in which the two areas, which are perpendicular to the corresponding selection gate, are placed. Also, in the case where the space is made the same space, it is possible to secure a wide adjacent cell gate gap and it is possible to easily arrange a contact with a sufficient contact margin. That is, it is possible to secure sufficient cell gate placement space as miniaturization progresses. Alternatively, in the cell gate placement shown in FIG. 27, while the space between the adjacent cell gates which are mutually placed in a back to back form is controlled by the demands of size there is a need to align the position with a high degree of accuracy and even if this kind of position alignment is not carried out with a high degree of accuracy the cell gate placement shown in FIG. 26 has the advantage that regularly forming the spaces and all the line widths within the memory block according to design is easy.

Each memory block within the semiconductor device related to the third embodiment of this invention manufactured by the manufacturing method above has its own cell gates and unlike the first embodiment of this invention it is possible to perform erasure in one block units. Also, it is possible to control the occurrence of narrowing and breakage of the resist pattern in the manufacturing process, and a line with no short circuit can be proposed.

Further, in the semiconductor device related to the third embodiment of this invention, the adjacent cell gate gap between the plurality of cell gates formed into a roughly U shaped open loop can be widened in the area which is perpendicular to the corresponding selection gate. Therefore, it is possible to arrange a contact with a sufficient contact adjustment margin and a small misalignment etc of the contact can be absorbed.

What is claimed is:
1. A semiconductor device comprising:
at least two adjacent memory cell blocks, each of the memory cell blocks having a plurality of memory cell units, each of the memory cell units having a plurality of electrically reprogrammable and erasable memory cells connected in series;
a plurality of cell gates selecting the plurality of memory cells within the two adjacent memory cell blocks, each of the plurality of cell gates formed with a closed loop, each of the loops connected to a corresponding memory cell of the memory cells in a corresponding memory cell unit of the memory cell units within one of the two adjacent memory cell blocks and connected to a corresponding memory cell of the memory cells in a corresponding memory cell unit of the plurality of memory cell units within the other memory cell block of the two adjacent memory cell blocks; and
a plurality of pairs of first and second selection gates selecting the memory cell block, the plurality of cell gates located between one pair of the first and second selection gates within a corresponding block of the memory cell block,
wherein each of the plurality of cell gates are arranged so that first gaps between adjacent cell gates of the cell gates at one or two lines of the loop in a first direction along which the two adjacent memory cell blocks are arranged, are wider than second gaps between adjacent cell gates of the cell gates at perpendicular lines of the loop in a second direction which is perpendicular to the first direction along which the two adjacent memory cell blocks are arranged.

2. The semiconductor device according to claim 1 further comprising contacts connecting the plurality of cell gates with wirings respectively, the contacts being arranged on the lines of the loop in the first direction.

3. A semiconductor device comprising:
a semiconductor substrate including a first memory cell block, a second memory cell block located adjacent to the first memory cell block in a first direction, and an active area extending to the first direction between the first and second memory cell blocks;
a first cell gate including a first line portion extending to a second direction which is perpendicular to the first direction in the first memory cell block, a second line portion extending to the second direction in the second memory cell block, a third line portion extending to the first direction and connecting one end of the first and second line portions and a fourth line portion extending to the first direction and connecting the other end of the first and second line portions;
a second cell gate including a fifth line portion extending to the second direction in the first memory cell block, a sixth line portion extending to the second direction in the second memory cell block, a seventh line portion located adjacent to the third line portion, extending to the first direction and connecting one of the fifth and sixth line portions, and a eighth line portion located adjacent to the fourth line portion, extending to the first direction and connecting the other end of the fifth and sixth line portions, the first and second line portions located between the fifth and sixth line portions and the third and fourth line portions located between the seventh and eighth line portions;

a pair of first select gates located in the first memory cell block, the first and fifth line portions located between the first select gates; and a pair of second select gates located in the second memory cell block, the second and sixth line portions located between the second select gates, wherein a first interval between the first and fifth line portions is same as a second interval between the second and sixth line portions and a third interval between the third and seventh line portions is wider than the first interval.

4. The semiconductor device according to claim 3 wherein a fourth interval between the fourth and eighth line portions is narrower than the third interval.

5. The semiconductor device according to claim 3 further comprising a first contact located on the third line portion and a second contact located on the seventh line portions, the first and second contacts shifted in the first direction each other.

6. A semiconductor device comprising:
a semiconductor substrate including a first memory cell block, a second memory cell block located adjacent to the first memory cell block in a first direction, a third memory cell block located between the first and the second memory cell blocks and an active area extending to the first direction between the first and second memory cell blocks;

a first cell gate including a first line portion extending to a second direction which is perpendicular to the first direction in the first memory cell block, a second line portion extending to the second direction in the third memory cell block, a third line portion extending to the first direction and connecting one end of the first and second line portions and a fourth line portion extending to the first direction and connecting the other end of the first and second line portions;

a second cell gate including a fifth line portion extending to the second direction in the first memory cell block, a sixth line portion extending to the second direction in the third memory cell block, a seventh line portion located adjacent to the third line portion, extending to the first direction and connecting one of the fifth and sixth line portions, and a eighth line portion located adjacent to the fourth line portion, extending to the first direction and connecting the other end of the fifth and sixth line portions, the first and second line portions located between the fifth and sixth line portions and the third and fourth line portions located between the seventh and eighth line portions;

a third cell gate including a ninth line portion extending to the second direction in the third memory cell block, a tenth line portion extending to the second direction in the second memory cell block, an eleventh line portion extending to the first direction and connecting one end of the ninth and tenth line portions and a twelfth line portion extending to the first direction and connecting the other end of the ninth and tenth line portions;

a fourth cell gate including a thirteenth line portion extending to the second direction in the third memory cell block, a fourteenth line portion extending to the second direction in the second memory cell block, an fifteenth line portion located adjacent to the eleventh line portion, extending to the first direction and connecting one end of the thirteenth and fourteenth line portions and a sixteenth line portion located adjacent to the twelfth line portions, extending to the first direction and connecting the other end of the thirteenth and fourteenth line portions, the ninth and tenth line portions located between the thirteenth and fourteenth line portions and the eleventh and twelfth line portions located between fifteenth and sixteenth line portions; and a pair of first select gates located in the third memory cell block, the second, sixth, ninth and thirteenth line portions located between the first select gates, wherein a first interval between the first and fifth line portions is narrower than a second interval between the third and seventh line portions.

7. The semiconductor device according to claim 6, wherein the first interval is same as a third interval between the second and sixth line portions, a fourth interval between the ninth and thirteenth line portions and a fifth interval between the tenth and fourteenth line portions.

8. The semiconductor device according to claim 6, wherein the second interval is same as s sixth interval between the fourth and eighth line portions, a seventh interval between the eleventh and fifteenth line portions and a eighth interval between the twelfth and sixteenth line portions.

9. The semiconductor device according to claim 6 further comprising a second select gate located between one of the first select gates and the first line portion of the first cell gate in the first memory cell block and a third select gate located between the other of the first select gates and the tenth line portion of the third cell gate in the second memory cell block.

* * * * *